US009727276B2

(12) United States Patent
Darragh et al.

(10) Patent No.: US 9,727,276 B2
(45) Date of Patent: Aug. 8, 2017

(54) MEASURING MEMORY WEAR AND DATA RETENTION INDIVIDUALLY BASED ON CELL VOLTAGE DISTRIBUTIONS

(71) Applicant: SanDisk Technologies Inc., Plano, TX (US)

(72) Inventors: Neil Richard Darragh, Edinburgh (GB); Sergey Anatolievich Gorobets, Edinburgh (GB); Liam Michael Parker, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/977,143

(22) Filed: Dec. 21, 2015

(65) Prior Publication Data

US 2016/0180951 A1 Jun. 23, 2016

Related U.S. Application Data

(60) Provisional application No. 62/095,608, filed on Dec. 22, 2014, provisional application No. 62/095,594, (Continued)

(51) Int. Cl.
*G11C 16/04* (2006.01)
*G06F 3/06* (2006.01)
(Continued)

(52) U.S. Cl.
CPC .......... *G06F 3/0653* (2013.01); *G06F 3/0625* (2013.01); *G06F 3/0634* (2013.01);
(Continued)

(58) Field of Classification Search
CPC ... G11C 16/349; G11C 11/5628; G11C 29/52; G11C 11/5644
(Continued)

(56) References Cited

U.S. PATENT DOCUMENTS 4,402,041 A 8/1983 Clark
5,812,527 A 9/1998 Kline et al.
(Continued)

OTHER PUBLICATIONS

International Search Report and Written Opinion of the International Searching Authority dated Jan. 7, 2016 for PCT Application No. PCT/US2015/055536 (12 pp.).

*Primary Examiner* — Gene Auduong
(74) *Attorney, Agent, or Firm* — Brinks Gilson & Lione

(57) ABSTRACT

A memory system or flash card may include a mechanism for memory cell measurement and analysis that independently measures/predicts memory wear/endurance, data retention (DR), read disturb, and/or remaining margin. These effects may be independently quantified by analyzing the state distributions of the individual voltage levels of the cells. In particular, a histogram of cell voltage distributions of the memory cells can be analyzed to identify signatures for certain effects (e.g. wear, DR, read disturb, margin, etc.). Those measurements may be used for block cycling, data loss prediction, or adjustments to memory parameters. Preemptive action at the appropriate time based on the measurements may lead to improved memory management and data management. That action may include calculating the remaining useful life of data stored in memory, cycling blocks, predicting data loss, trade-off or dynamic adjustments of memory parameters.

13 Claims, 30 Drawing Sheets

Related U.S. Application Data filed on Dec. 22, 2014, provisional application No. 62/095,633, filed on Dec. 22, 2014, provisional application No. 62/095,612, filed on Dec. 22, 2014, provisional application No. 62/095,619, filed on Dec. 22, 2014, provisional application No. 62/095,623, filed on Dec. 22, 2014, provisional application No. 62/095,586, filed on Dec. 22, 2014.

(51) Int. Cl.

| | | |
|---|---|---|
| *G11C 16/28* | (2006.01) | |
| *G11C 16/32* | (2006.01) | |
| *G06F 11/07* | (2006.01) | |
| *G11C 16/34* | (2006.01) | |
| *G11C 11/56* | (2006.01) | |
| *G11C 16/12* | (2006.01) | |
| *G11C 29/02* | (2006.01) | |
| *G06F 11/00* | (2006.01) | |
| *G11C 29/56* | (2006.01) | |
| *G11C 29/52* | (2006.01) | |

(52) U.S. Cl.
CPC .......... *G06F 11/008* (2013.01); *G06F 11/073* (2013.01); *G06F 11/076* (2013.01); *G06F 11/079* (2013.01); *G06F 11/0793* (2013.01); *G11C 11/5628* (2013.01); *G11C 16/12* (2013.01); *G11C 16/28* (2013.01); *G11C 16/32* (2013.01); *G11C 16/349* (2013.01); *G11C 16/3418* (2013.01); *G11C 16/3422* (2013.01); *G11C 16/3495* (2013.01); *G11C 29/028* (2013.01); *G11C 16/0483* (2013.01); *G11C 29/52* (2013.01); *G11C 29/56008* (2013.01)

(58) Field of Classification Search
USPC .............. 365/185.09, 185.11, 185.18, 185.2
See application file for complete search history.

(56) References Cited

U.S. PATENT DOCUMENTS

| | | | |
|---|---|---|---|
| 7,898,865 B2 * | 3/2011 | Baek | G11C 11/5628 365/185.11 |
| 8,213,236 B1 | 7/2012 | Wu et al. | |
| 8,737,141 B2 * | 5/2014 | Melik-Martirosian | G11C 16/349 365/189.011 |
| 9,349,489 B2 * | 5/2016 | Desireddi | G06F 12/0246 |
| 2007/0208904 A1 | 9/2007 | Hsieh et al. | |
| 2009/0168525 A1 | 7/2009 | Olbrich et al. | |
| 2010/0046289 A1 | 2/2010 | Baek et al. | |
| 2011/0173378 A1 * | 7/2011 | Filor | G06F 11/004 711/103 |
| 2012/0124273 A1 * | 5/2012 | Goss | G11C 16/349 711/103 |
| 2012/0239858 A1 | 9/2012 | Melik-Martirosian | |
| 2014/0136884 A1 | 5/2014 | Werner et al. | |
| 2014/0201580 A1 | 7/2014 | Desireddi et al. | |
| 2014/0208174 A1 | 7/2014 | Ellis et al. | |
| 2015/0186072 A1 * | 7/2015 | Darragh | G06F 3/0653 711/103 |
| 2015/0199268 A1 | 7/2015 | Davis et al. | |
| 2015/0286421 A1 | 10/2015 | Chen et al. | |

* cited by examiner

Figure 11

|  | Die 0 (CE 0) | Die 1 (CE 1) | Die 2 (CE 2) | Die 3 (CE 3) |
|---|---|---|---|---|
| Channel 0 | ☐ | ☐ | ☐ | ☐ |
|  | Super | Super | Super | Super |
| Channel 1 | ☐ | ☐ | ☐ | ☐ |
|  | Device | Device | Device | Device |
| Channel 2 | ☐ | ☐ | ☐ | ☐ |
|  | #0 | #1 | #2 | #3 |
| Channel 3 | ☐ | ☐ | ☐ | ☐ |
| Channel 4 | ☐ | ☐ | ☐ | ☐ |
| Channel 5 | ☐ | ☐ | ☐ | ☐ |
| Channel 6 | ☐ | ☐ | ☐ | ☐ |
| Channel 7 | ☐ | ☐ | ☐ | ☐ |
| Channel 8 | ☐ | ☐ | ☐ | ☐ |
| Channel 9 | ☐ | ☐ | ☐ | ☐ |
| Channel 10 | ☐ | ☐ | ☐ | ☐ |
| Channel 11 | ☐ | ☐ | ☐ | ☐ |
| Channel 12 | ☐ | ☐ | ☐ | ☐ |
| Channel 13 | ☐ | ☐ | ☐ | ☐ |
| Channel 14 | ☐ | ☐ | ☐ | ☐ |
| Channel 15 | ☐ | ☐ | ☐ | ☐ |

MEASURING MEMORY WEAR AND DATA RETENTION INDIVIDUALLY BASED ON CELL VOLTAGE DISTRIBUTIONS

PRIORITY AND RELATED APPLICATIONS

This application claims priority to Provisional patent applications entitled "MEASURING MEMORY WEAR AND DATA RETENTION INDIVIDUALLY BASED ON CELL VOLTAGE DISTRIBUTIONS" assigned Provisional Application Ser. No. 62/095,608; "DYNAMIC PROGRAMMING ADJUSTMENTS IN MEMORY FOR NON-CRITICAL OR LOW POWER MODE TASKS" assigned Provisional Application Ser. No. 62/095,594; "TRADE-OFF ADJUSTMENTS OF MEMORY PARAMETERS BASED ON MEMORY WEAR OR DATA RETENTION" assigned Provisional Application Ser. No. 62/095,633; "DYNAMIC PROGRAMMING ADJUSTMENTS BASED ON MEMORY WEAR, HEALTH, AND ENDURANCE" assigned Provisional Application Ser. No. 62/095,612; "END OF LIFE PREDICTION BASED ON MEMORY WEAR" assigned Provisional Application Ser. No. 62/095,619; "MEMORY BLOCK CYCLING BASED ON MEMORY WEAR OR DATA RETENTION" assigned Provisional Application Ser. No. 62/095,623; "PREDICTING MEMORY DATA LOSS BASED ON TEMPERATURE ACCELERATED STRESS TIME" assigned Provisional Application Ser. No. 62/095,586; each of which were filed on Dec. 22, 2014 and each of which is hereby incorporated by reference.

This application is further related to U.S. patent Ser. No. 14/977,174, entitled "END OF LIFE PREDICTION BASED ON MEMORY WEAR," filed on Dec. 21, 2015; U.S. patent Ser. No. 14/977,155, entitled "MEMORY BLOCK CYCLING BASED ON MEMORY WEAR OR DATA RETENTION," filed on Dec. 21, 2015; U.S. patent Ser. No. 14/977,191, entitled "PREDICTING MEMORY DATA LOSS BASED ON TEMPERATURE ACCELERATED STRESS TIME," filed on Dec. 21, 2015; U.S. patent Ser. No. 14/977,237, entitled "TRADE-OFF ADJUSTMENTS OF MEMORY PARAMETERS BASED ON MEMORY WEAR OR DATA RETENTION," filed on Dec. 21, 2015; U.S. patent Ser. No. 14/977,222, entitled "DYNAMIC PROGRAMMING ADJUSTMENTS BASED ON MEMORY WEAR, HEALTH, AND ENDURANCE," filed on Dec. 21, 2015; U.S. patent Ser. No. 14/977,227, entitled "DYNAMIC PROGRAMMING ADJUSTMENTS IN MEMORY FOR NON-CRITICAL OR LOW POWER MODE TASKS," filed on Dec. 21, 2015; U.S. patent Ser. No. 14/977,144, entitled "FAILED BIT COUNT MEMORY ANALYTICS," filed on Dec. 21, 2015; U.S. patent Ser. No. 14/977,187, entitled "REMOVING READ DISTURB SIGNATURES FOR MEMORY ANALYTICS," filed on Dec. 21, 2015; and U.S. patent Ser. No. 14/977,198, entitled "END OF LIFE PREDICTION TO REDUCE RETENTION TRIGGERED OPERATIONS," filed on Dec. 21, 2015; the entire disclosure of each is hereby incorporated by reference.

TECHNICAL FIELD

This application relates generally to memory devices. More specifically, this application relates to the measurement of wear endurance, wear remaining, and data retention in non-volatile semiconductor flash memory. Those measurements may be used for block cycling, data loss prediction, end of life prediction, or adjustments to memory parameters.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. As the non-volatile memory cell scales to smaller dimensions with higher capacity per unit area, the cell endurance due to program and erase cycling, and disturbances (e.g. due to either read or program) may become more prominent. The defect level during the silicon process may become elevated as the cell dimension shrinks and process complexity increases. Likewise, time and temperature may hinder data retention (DR) in a memory device. Increased time and/or temperature may cause a device to wear more quickly and/or lose data (i.e. data retention loss). Bit error rate (BER) may be used as an estimate for wear, DR, or remaining margin; however, BER is merely the result of the problem and may not be an accurate predictor. Further, using BER does allow a distinction between memory wear and data retention. For example, a high BER may be caused by any one of wear, read disturb errors, DR, or other memory errors.

SUMMARY

At any moment, the integrity of data in a block may be impacted by any combination of wear, retention loss, read disturb or a presence of bad cells. Being able to measure at any time and in any block, data retention loss and rate independently from wear, read disturb and other phenomena may provide improved memory analytics. In particular, it may be desirable to independently measure/predict memory wear/endurance, data retention (DR), and/or remaining margin. The wear (wear endured and wear remaining), DR (retention capability and retention loss), and margin remaining of memory cells may be independently quantified by analyzing the state distributions of the individual voltage levels of the cells. Rather than relying on BER as an indicator, an independent measurement may be made for any of wear, endurance, DR, or read disturb. Pre-emptive action at the appropriate time based on the measurements may lead to improved memory management and data management. That action may include calculating the remaining useful life of data stored in memory, cycling blocks, predicting data loss, trade-off or dynamic adjustments of memory parameters.

BRIEF DESCRIPTION OF THE DRAWINGS

FIG. 11 is a diagram of exemplary super blocks.

BRIEF DESCRIPTION OF THE PRESENTLY PREFERRED EMBODIMENTS

The system described herein can independently quantize wear and data retention. The quantization may be based on an analysis of the cell voltage distribution or a bit error rate (BER) analysis. Changes to the cell voltage distribution or BER are analyzed to identify either wear or data retention problems.

Data retention may refer to either a gain or loss of charge over time. Data may be lost if the charge gain/loss passes over a threshold voltage which then changes the value of the cell. An erase cycle may reset the charge for the cells in a block, which can correct the gain/loss of charge over time. Read disturb errors may be caused when cells in a memory block change over time (e.g. become programmed unintentionally). It may be due to a particular cell being excessively read which may cause the read disturb error for neighboring cells. In particular, a cell that is not being read, but receives elevated voltage stress because a neighboring cell is being read. Charge may collect on floating gates, which may cause a cell to appear to be programmed. The read disturb error may result in a data loss. ECC may correct the error and an erase cycle can reset the programming of the cell.

A retention capability may be predicted at any given program/erase (P/E) cycle and on any block, from a measurement of the wear and/or retention loss rate of that block. DR predictions may be used for block leveling, recovering wasted margins, extending endurance, and for other product capabilities. Periodic measurements of stored data can be used to dynamically determine the wear or retention loss rates of individual blocks.

Memory wear refers to the finite limit of program-erase (P/E) cycles for the memory. This may also be referred to as endurance. Memory may be able to withstand a threshold number of P/E cycles before memory wear deteriorates the memory blocks. A memory block that has failed should not be used further. Wear leveling may be utilized as an attempt to normalize P/E cycles across all blocks. This may prevent blocks from receiving excessive P/E cycles.

Figure 1:
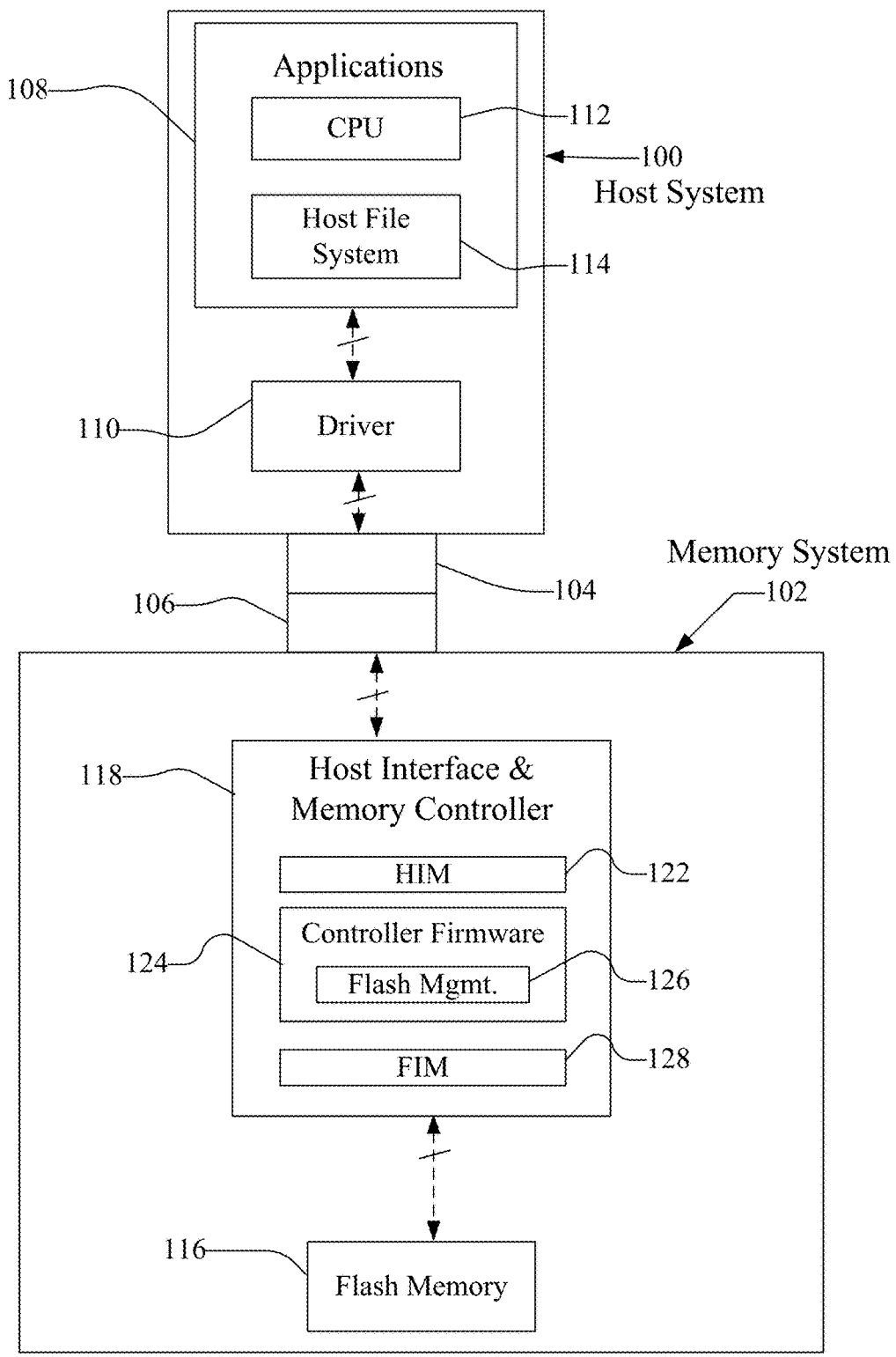
FIG. 1 is a block diagram of a host connected with a memory system having non-volatile memory.

A flash memory system suitable for use in implementing aspects of the invention is shown in FIGS. 1-5. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module 128. Flash management logic 126 may be part of the controller firmware 214 for internal memory management operations such as garbage collection. One or more flash interface modules (FIMs) 128 may provide a communication interface between the controller with the flash memory 116.

A flash transformation layer ("FTL") or media management layer ("MML") may be integrated in the flash management 126 and may handle flash errors and interfacing with the host. In particular, flash management 126 is part of controller firmware 124 and MML may be a module in flash management. The MML may be responsible for the internals of NAND management. In particular, the MML may include instructions in the memory device firmware which translates writes from the host 100 into writes to the flash memory 116. The MML may be needed because: 1) the flash memory may have limited endurance; 2) the flash memory 116 may only be written in multiples of pages; and/or 3) the flash memory 116 may not be written unless it is erased as a block. The MML understands these potential limitations of the flash memory 116 which may not be visible to the host 100. Accordingly, the MML attempts to translate the writes from host 100 into writes into the flash memory 116. As described below, an algorithm for measuring/predicting memory wear/endurance, data retention (DR), and/or remaining margin (e.g. read disturb errors) may also be stored in the MML. That algorithm may analyze the state distributions of the individual voltage levels of the cells, and utilize histogram data of cell voltage distributions of the memory cells to identify signatures for certain effects (e.g. wear, DR, margin, etc.). The flash memory 116 or other memory may be multi-level cell (MLC) or single-level cell (SLC) memory. MLC and SLC memory are further described below. Either SLC or MLC may be included as part of the device controller 118 rather than as part of the flash memory 116.

Figure 2:
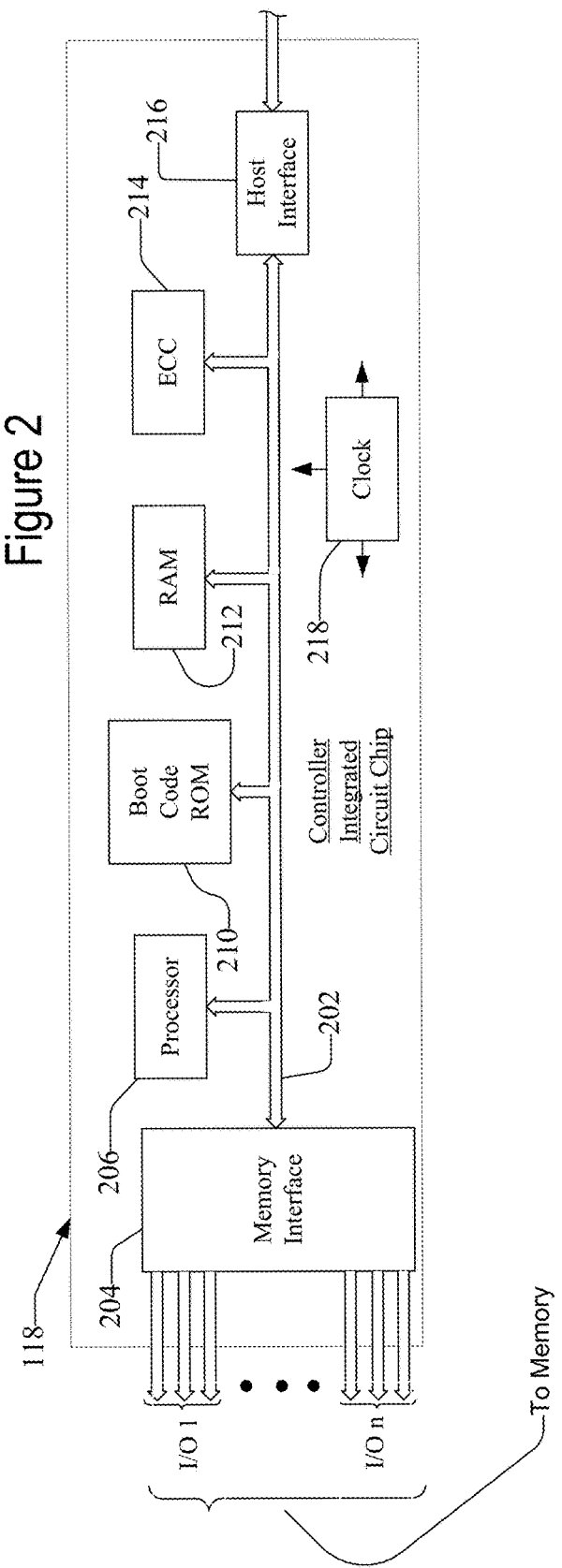
FIG. 2 is a block diagram of an exemplary flash memory device controller for use in the system of FIG. 1.

The device controller 118 may be implemented on a single integrated circuit chip, such as an application specific integrated circuit (ASIC) such as shown in FIG. 2. The processor 206 of the device controller 118 may be configured as a multi-thread processor capable of communicating via a memory interface 204 having I/O ports for each memory bank in the flash memory 116. The device controller 118 may include an internal clock 218. The processor 206 communicates with an error correction code (ECC) module 214, a RAM buffer 212, a host interface 216, and boot code ROM 210 via an internal data bus 202.

The host interface 216 may provide the data connection with the host. The memory interface 204 may be one or more FIMs 128 from FIG. 1. The memory interface 204 allows the device controller 118 to communicate with the flash memory 116. The RAM 212 may be a static random-access memory (SRAM). The ROM 210 may be used to initialize a memory system 102, such as a flash memory device. The memory system 102 that is initialized may be referred to as a card. The ROM 210 in FIG. 2 may be a region of read only memory whose purpose is to provide boot code to the RAM for processing a program, such as the initialization and booting of the memory system 102. The ROM may be present in the ASIC rather than the flash memory chip.

Figure 3:
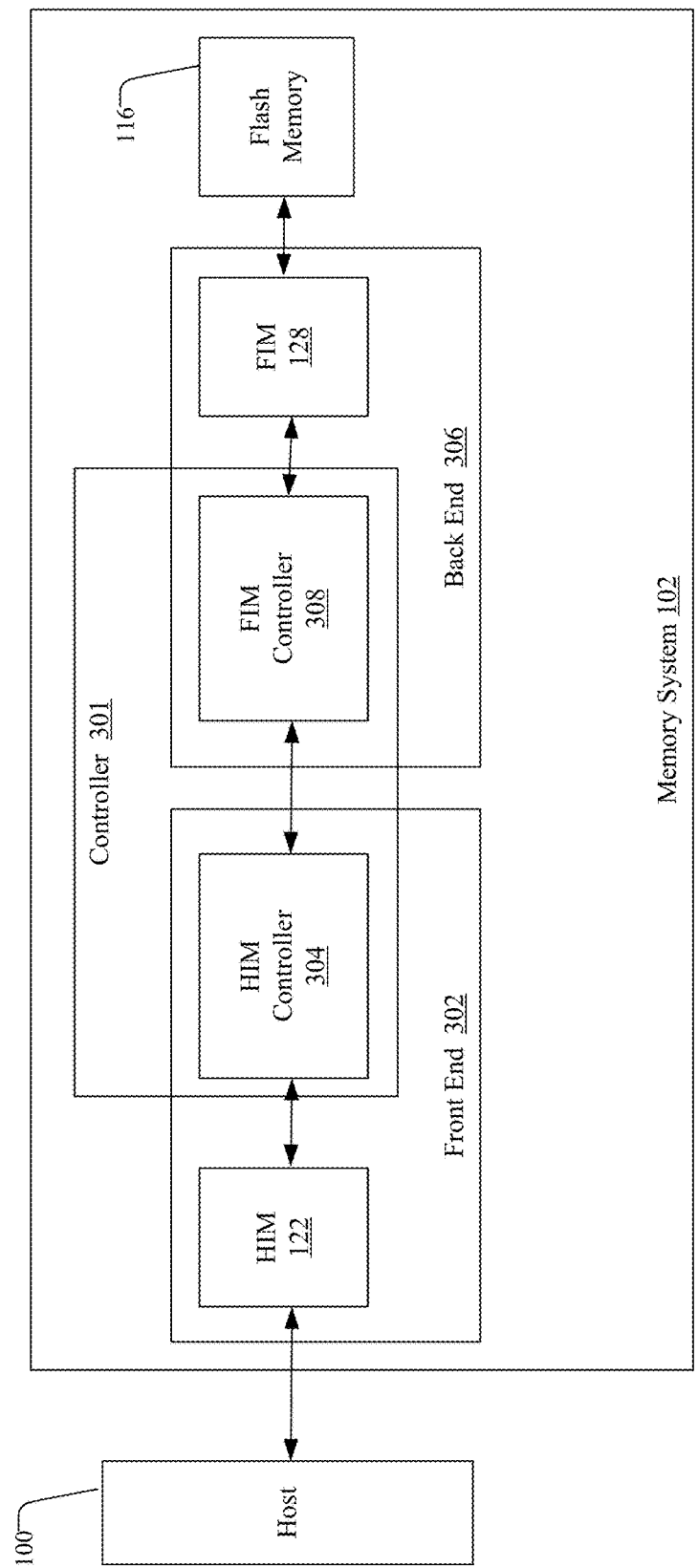
FIG. 3 is a block diagram of an alternative memory communication system.

FIG. 3 is a block diagram of an alternative memory communication system. The host system 100 is in communication with the memory system 102 as discussed with respect to FIG. 1. The memory system 102 includes a front end 302 and a back end 306 coupled with the flash memory 116. In one embodiment, the front end 302 and the back end 306 may be referred to as the memory controller and may be part of the device controller 118. The front end 302 may logically include a Host Interface Module (HIM) 122 and a HIM controller 304. The back end 306 may logically include a Flash Interface Module (FIM) 128 and a FIM controller 308. Accordingly, the controller 301 may be logically portioned into two modules, the HIM controller 304 and the FIM controller 308. The HIM 122 provides interface functionality for the host device 100, and the FIM 128 provides interface functionality for the flash memory 116. The FIM controller 308 may include the algorithms implementing the independent analysis of wear and data retention as described below.

In operation, data is received from the HIM 122 by the HIM controller 304 during a write operation of host device 100 on the memory system 102. The HIM controller 304 may pass control of data received to the FIM controller 308, which may include the FTL discussed above. The FIM controller 308 may determine how the received data is to be written onto the flash memory 116 optimally. The received data may be provided to the FIM 128 by the FIM controller 308 for writing data onto the flash memory 116 based on the determination made by the FIM controller 308. In particular, depending on the categorization of the data it may be written differently (e.g. to MLC or retained in an update block).

Figure 4:
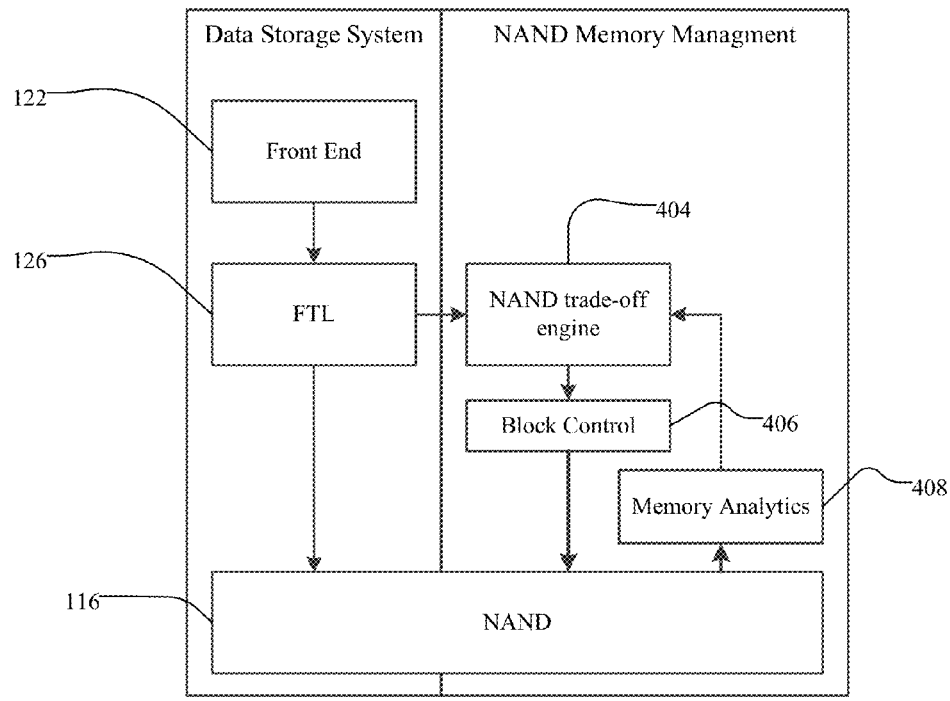
FIG. 4 is a block diagram of an exemplary memory system architecture.

FIG. 4 is a block diagram of an exemplary memory system architecture. The data storage system includes a front end 128, a flash transformation layer (FTL) 126, and access to the NAND memory 116. The data storage system has its memory managed by the NAND memory management in one embodiment. The NAND memory management may include a NAND trade-off engine 404, a block control module 406, and a memory analytics module 408. The NAND trade-off engine 404 may dynamically measure device performance and allow for adjustments to the device based on the measurements. Power, performance, endurance, and/or data retention may be emphasized or de-emphasized in the trade-off. For example, trim parameters may be adjusted based on the wear or data retention loss for certain blocks. The trade-off may be automated for the device or it may be adjusted by the user/host as described with respect to FIG. 5. The block control module 406 controls operations of the blocks. For example, the trim parameters that are adjusted may be individually adjusted for each block based on the measurements of the block's health (e.g. wear, data retention, etc.), which is further described below. The memory analytics module 408 receives the individual health measurements for blocks or other units of the memory. This health of the blocks may include the wear, data retention, endurance, etc. which may be calculated as described with respect to FIGS. 12-18. In particular, the memory analytics module 408 may utilize cell voltage distribution to calculate the wear and the data retention independently for each individual block (or individual cells/wordlines/meta-blocks, etc.). The architecture shown in FIG. 4 is merely exemplary and is not limited to the use of a specific memory analytics implementation. Likewise, the architecture is not limited to NAND flash, which is merely exemplary.

Figure 5:
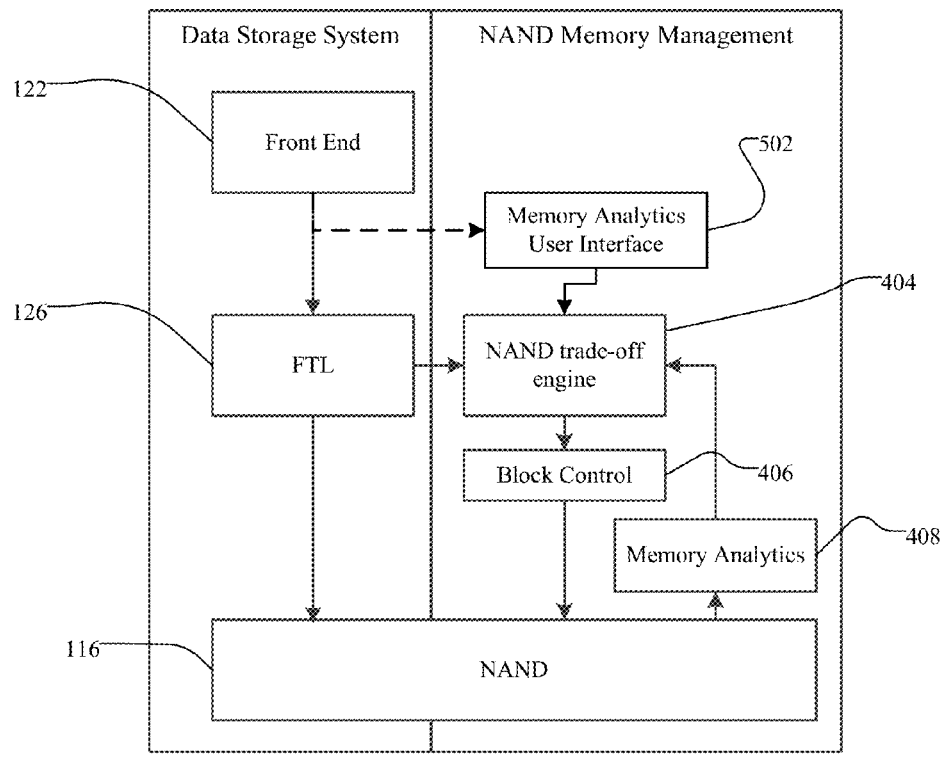
FIG. 5 is a block diagram of another exemplary memory system architecture.

FIG. 5 is a block diagram of another exemplary memory system architecture. The system in FIG. 5 is similar to the system in FIG. 4, except of the addition of a memory analytics user interface 502. The memory analytics user interface 502 may receive input from the user/host (through the front end 122) that is translated into system specific trade-off bias. In particular, the memory analytics user interface 502 may be user controlled by providing the user with an interface for selecting the particular trade-offs (e.g. low/high performance vs. high/low endurance or high/low data retention). In one embodiment, the memory analytics user interface 502 may be configured at factory and may be one way to generate different product types (e.g. high performance cards vs. high endurance cards).

Figure 6:
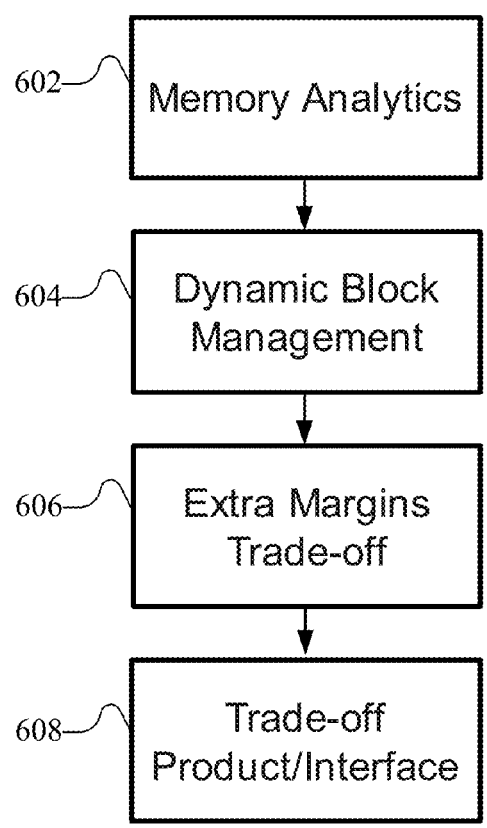
FIG. 6 is a block diagram of an exemplary memory analysis process.

FIG. 6 is a block diagram of an exemplary memory analysis process. The memory analytics 602 may include more precise measurements (including voltage and programming time) of the memory. For example, calculation and tracking of block level margins in data retention, endurance, performance, rates of change may be measured and tracked. That data can be used for prediction of blocks' health towards end of life. The memory analytics may be performed by the memory analytics module 408 in one embodiment. In one embodiment described below, the data retention (rate/loss) and the wear of individual blocks may be measured and tracked independently of one another.

Dynamic block management 604 may include leveling usage of blocks and hot/cold data mapping. This block management may be at the individual block level and may include independent and dynamic setting of trim parameters as further discussed below. Further, the management may include narrowing and recovering the margin distribution. The extra margins trade-offs 606 may include using recovered extra margins to trade off one aspect for another for additional benefits, and may include shifting margin distributions. The trade-off product/interface 608 may include configuring product type at production time, and dynamically detecting and taking advantage of idle time. This may allow a user to configure trade-offs (e.g. reduced performance for improved endurance).

Figure 7:
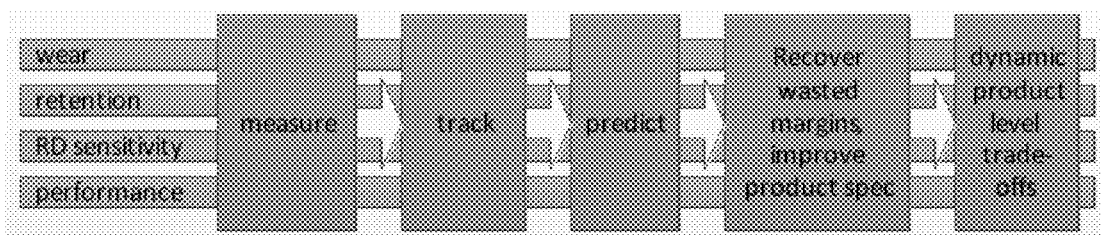
FIG. 7 is a block diagram of another exemplary memory analysis process.

FIG. 7 is a block diagram of another exemplary memory analysis process. The process may be within the memory analytics module 408 in one embodiment. Memory analytics may include an individual and independent analysis of wear, data retention, read disturb sensitivity, and/or performance. Each of these parameters may be measured and tracked (compared over periodic measurements). Based on the tracking, there may be a prediction of certain values (e.g. overall endurance, end of life, data retention loss rate). Based on the predictions, certain functions may be performed, including block leveling or other system management functions based on the individual values (e.g. wear or data retention). Adjustments can be made for dynamic block management based on the predictions. Trade-offs (e.g. performance vs. endurance/retention) may be automatically implemented (or implemented by the host) based on the measurements and predictions. As described below, wear may be calculated for individual blocks and those values may be used for implementing certain system processes (block cycling or leveling) and programming can be adjusted dynamically based on those values.

Figure 8:
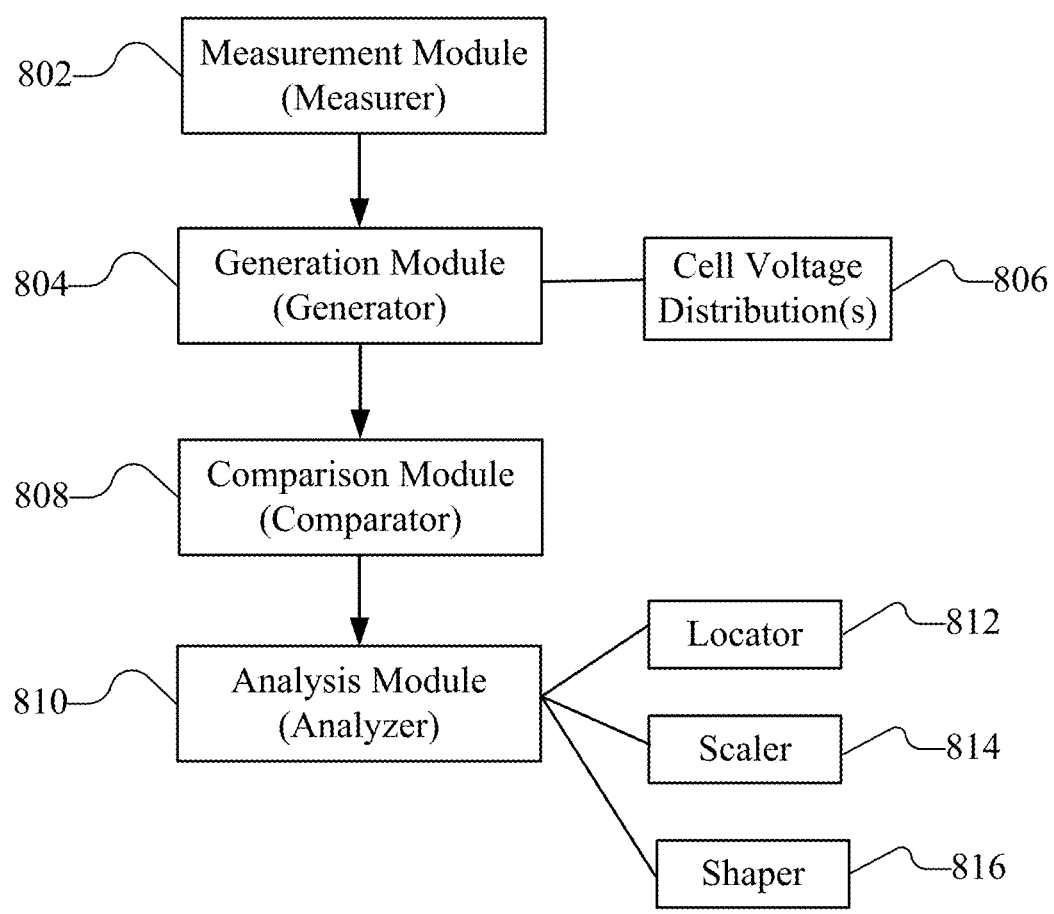
FIG. 8 is a block diagram of a system for wear and retention analysis.

FIG. 8 is a block diagram of a system for wear and retention analysis. In particular, FIG. 8 illustrates modules for performing the wear and retention analysis described below. A measurement module 802 or measurer may measure the cell voltages. For example, special read commands may be issued, such as those described below with respect to FIG. 18. The cell voltage values can then be used generate a cell voltage distribution 806 by the generation module 804 or generator. An exemplary cell voltage distribution is shown below in FIGS. 12-13. There may be multiple cell voltage distributions 806 that are compared by the comparison module 808 or comparator. The cell voltage distributions may be periodically generated and compared with each other, or compared with a reference cell voltage distribution that was generated when the memory was fresh and new (e.g. at factory). In alternative embodiments, the absolute values of a cell voltage distribution may be used to estimate wear and data retention of memory (without comparing other distributions). An analysis module 810 or analyzer may calculate or estimate wear and/or data retention based on the cell voltage distribution. Based on the wear and/or data retention, the analysis module 810 may make further calculations discussed below, including but not limited to calculating the remaining useful life of data stored in memory, cycling blocks, predicting data loss, trade-off or dynamic adjustments of memory parameters. In particular, modules such as a locator 812, scaler 814, and/or shaper 816 may analyze the cell voltage distribution as further described with respect to FIG. 18. The locator 812 can determine data retention based on a location shift of the states in the cell voltage distribution as described with respect to FIG. 20. The scaler 814 may determine wear based on changes to the width of the states in the cell voltage distribution as described below with respect to FIG. 22. The shaper 816 may determine wear based on changes to the shape of the states in the cell voltage distribution as described below with respect to FIG. 23.

The system may be implemented in many different ways. Each module, such as the measurement module 802, the generation module 804, the comparison module 806, and the analysis module 810, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, for example, that comprises instructions executable with the processor or other processor to implement one or more of the features of the module. When any one of the modules includes the portion of the memory that comprises instructions executable with the processor, the module may or may not include the processor. In some examples, each module may just be the portion of the memory or other physical memory that comprises instructions executable with the processor or other processor to implement the features of the corresponding module without the module including any other hardware. Because each module includes at least some hardware even when the included hardware comprises software, each module may be interchangeably referred to as a hardware module.

The data retention results or memory wear results from the cell voltage distribution changes may be tracked and stored (e.g. in the flash memory or within the controller). For example, a system table may track the changes in the cell voltage distributions and resultant changes in data retention and/or wear. By keeping an ongoing record of this information, a more accurate determination can be made regarding both wear and data retention. This information may be used for optimizing short term and long term storage of data. In particular, data that is not accessed frequently (long term storage or "cold data") should be stored where data retention is high. The variation in data retention may be block by block or die by die.

In one embodiment, each comparison of a currently measured cell voltage distribution may be compared with a reference cell voltage distribution (e.g. when the memory "fresh" such as at factory or at the first use). This reference cell voltage distribution is compared with each of the cell voltage distributions that are periodically measured such that a rate at which the data is degrading in the cell can be determined. The determinations that can be made from the calculations include:

Wear that a population of cells has endured;
Rate at which the population of cells is wearing;
Expected wear remaining of the population of cells;
Retention loss of the data stored in the cells;
Rate of retention loss of the data stored in the cells;
Margin to further retention loss can be determined; and
Retention loss rate may be used as a metric for retention capability.

Figure 9:
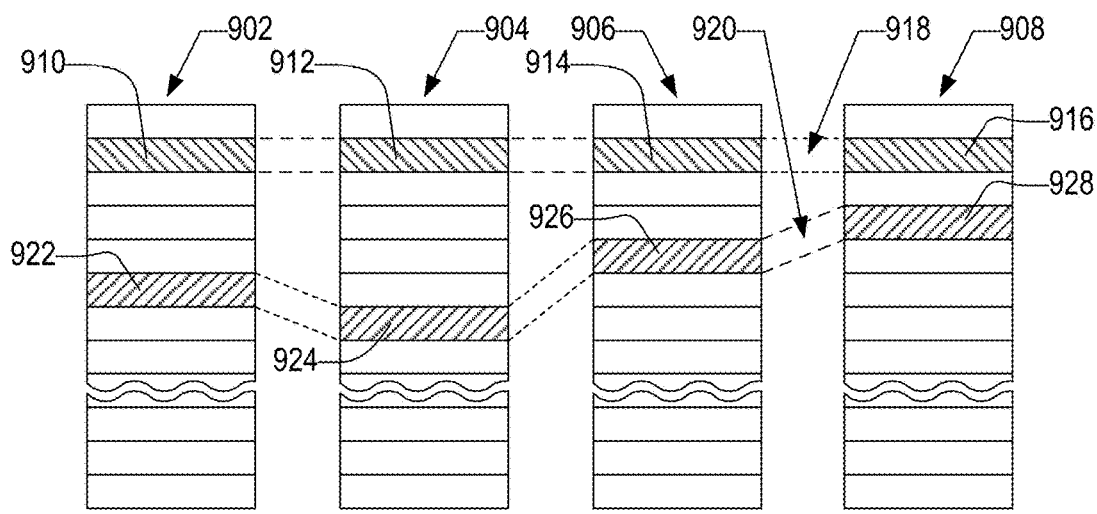
FIG. 9 is an example physical memory organization of the system of FIG. 1.
Figure 10:
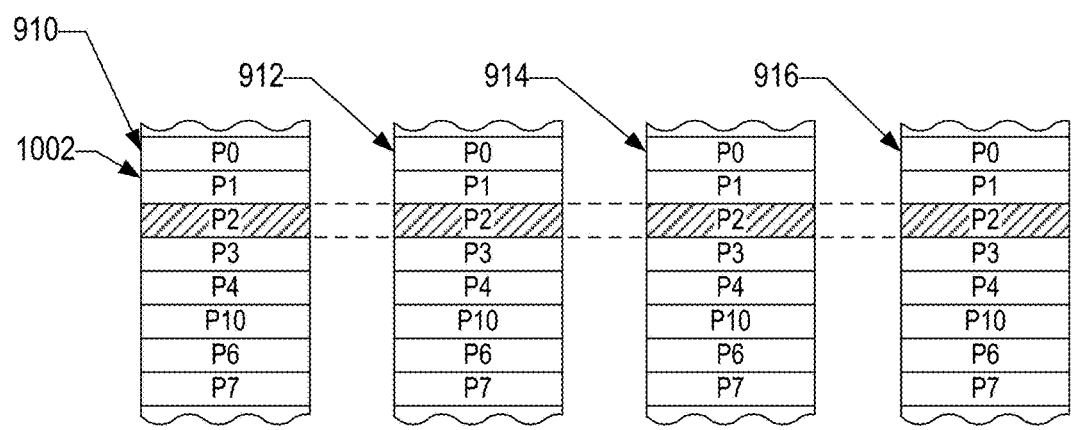
FIG. 10 is an expanded view of a portion of the physical memory of FIG. 4.

FIG. 9 conceptually illustrates an organization of the flash memory 116 (FIG. 1) as a cell array. FIGS. 9-10 illustrate different sizes/groups of blocks/cells that may be subject to the memory analytics described herein. The flash memory 116 may include multiple memory cell arrays which are each separately controlled by a single or multiple memory controllers 118. Four planes or sub-arrays 902, 904, 906, and 908 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 9 by rectangles, such as blocks 910, 912, 914, and 916, located in respective planes 902, 904, 906, and 908. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 910, 912, 914, and 916 are shown to form one metablock 918. All of the cells within a metablock are typically erased together. The blocks used to form a metablock need not be restricted to the same relative locations within their respective planes, as is shown in a second metablock 920 made up of blocks 922, 924, 926, and 928. Although it may be preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

The individual blocks are in turn divided for operational purposes into pages of memory cells, as illustrated in FIG. 10. The organization may be based on a different level (other than block or page level) including at the word line level as further described below. The memory cells of each of the blocks 910, 912, 914, and 916, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 1002 is illustrated in FIG. 9, being formed of one physical page from each of the four blocks 910, 912, 914, and 916. The metapage 1002, for example, includes the page P2 in each of the four blocks but the pages of a metapage need not necessarily have the same relative position within each of the blocks. A metapage may be the maximum unit of programming.

FIGS. 9 and 10 are merely exemplary arrangements of pages. The organization of wordlines may be used rather than pages. Likewise, the sizes of pages (e.g. metapages) may vary for the memory analytics discussed herein. In one embodiment, there may be flash super blocks. FIG. 11 illustrates flash super blocks and wordlines are further illustrated in FIGS. 14-15.

FIG. 11 illustrates an arrangement of super devices or super blocks. Super blocks may be similar to or the same as metablocks. Super blocks may include erased blocks from different die (e.g. two erased blocks from different planes), accessed via a controller's NAND channels. Super blocks may be the smallest erasable unit in some cases. A super block may be broken into separate erased blocks which can be used to reconstruct a new one. For memory analytics, erased blocks may be grouped based on different characteristics to make a super block as uniform as possible. A super device may be a group of flash dies that spans across all 16 channels as shown in FIG. 11. The flash dies that form super devices may be fixed through the life of the drive. FIG. 11 illustrates four super devices. In alternative embodiments, some capacity drives may not have all four dies populated. Depending on the size of the drive, fewer dies per channel may be populated. A super block may be a group of erase blocks within a super device. Since the super block spans multiple channels, it may be concurrently writing to the all die within a super block. With single-plane operations, each die may contribute one erase block to a super block. As a result, each super block may have the same number erase blocks as die within a super block. Advantages for using super blocks include fewer blocks to manage and initialize.

For example, instead of managing erase-block lists, the lists may cover super-block lists. Also, program/erase (PIE) counts and valid-page counters may be managed at the super-block level. Another advantage includes fewer metadata pages because each metadata pages in a super block captures the metadata for multiple erase blocks. Without super blocks, each erase block would have a metadata page that used only a fraction of the page. Super blocks may reduce the number of open blocks that are written to. For host writes there may be only fewer super blocks for writing instead of a larger number of erase blocks.

Figure 12:
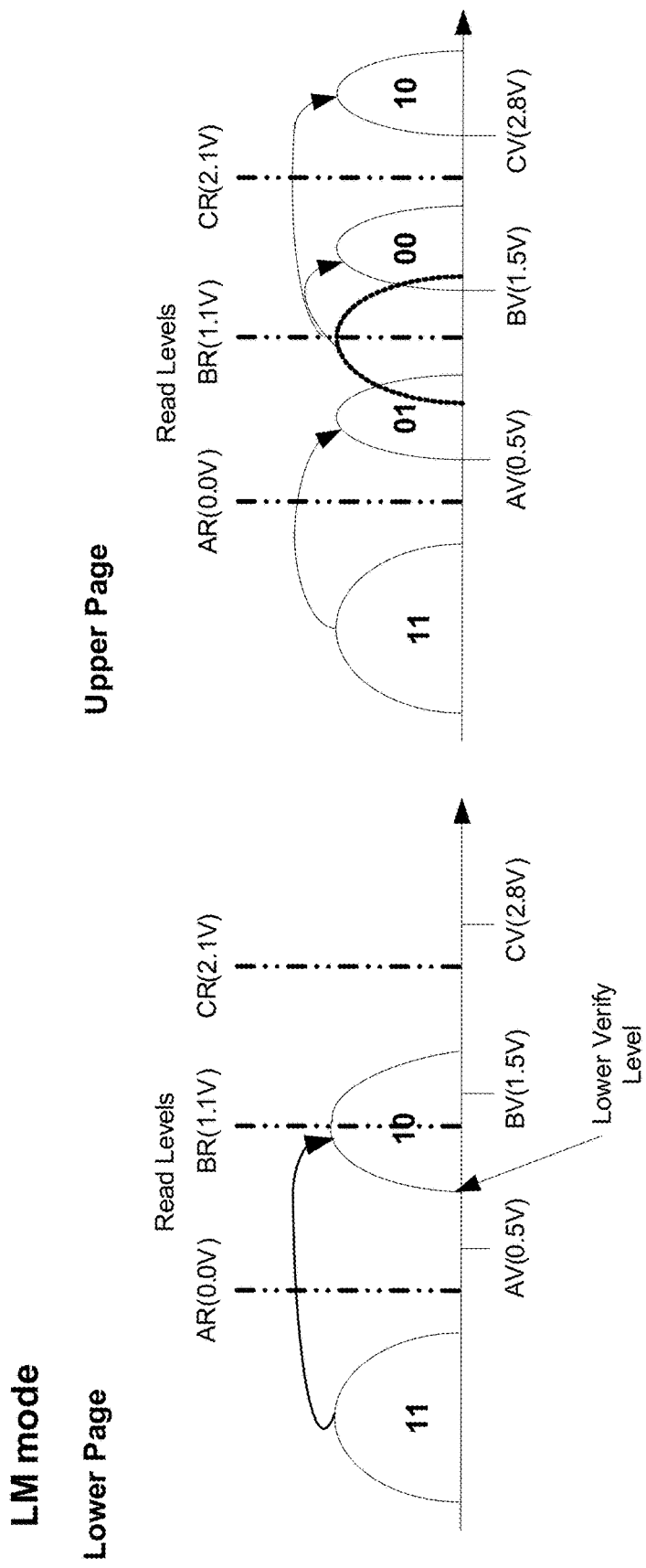
FIG. 12 is a diagram illustrating charge levels in a multi-level cell memory operated to store two bits of data in a memory cell.

FIG. 12 is a diagram illustrating charge levels in cell memory. The charge storage elements of the memory cells are most commonly conductive floating gates but may alternatively be non-conductive dielectric charge trapping material. Each cell or memory unit may store a certain number of bits of data per cell. In FIG. 12, MLC memory may store four states and can retain two bits of data: 00 or 01 and 10 or 11. Alternatively, MLC memory may store eight states for retaining three bits of data as shown in FIG. 4. In other embodiments, there may be a different number of bits per cell.

The right side of FIG. 12 illustrates a memory cell that is operated to store two bits of data. This memory scheme may be referred to as eX2 memory because it has two bits per cell. The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. FIG. 12 illustrates a two-bit per cell memory scheme in which either four states (Erase, A, B, C) or with two states of SLC memory. This two-bit per cell memory (i.e. eX2) memory can operate as SLC or as four state MLC. Likewise, as described with respect to FIG. 4, three-bit per cell memory (i.e. eX3) can operate either as SLC or as eight state MLC. The NAND circuitry may be configured for only a certain number of bit per cell MLC memory, but still operate as SLC. In other words, MLC memory can operate as a MLC or SLC, but with regard to the MLC operation three bit per cell memory cannot operate as two bit per cell memory and vice-versa. The embodiments described below utilize any MLC memory scheme's ability to work with SLC to then operate at different bits per cell.

FIG. 12 illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. The read margins are established for identifying each state. The three read margins (AR, BR, CR) delineate the four states. Likewise, there is a verify level (i.e. a voltage level) for establishing the lower bound for programming each state.

FIG. 12 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state or erase state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 13:
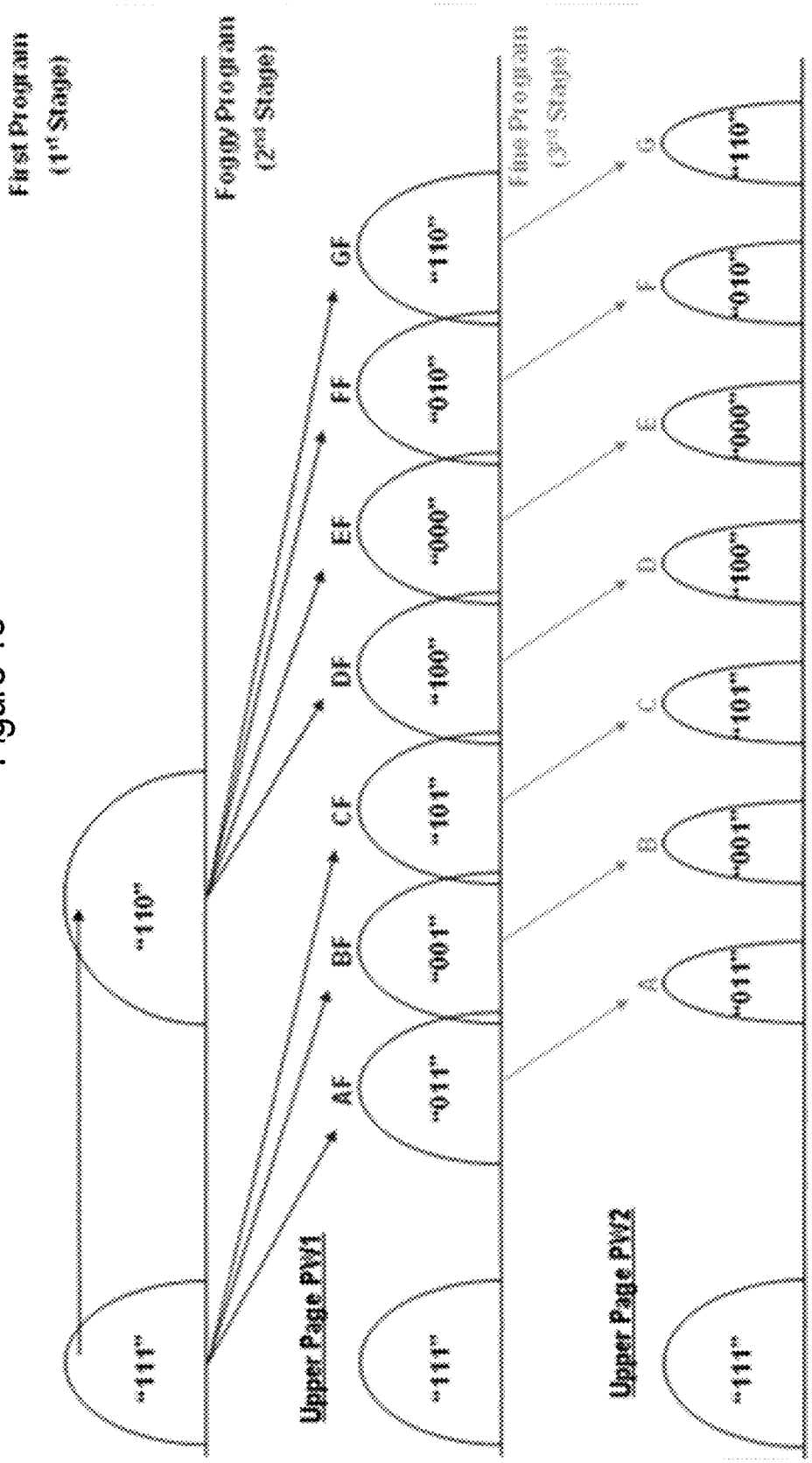
FIG. 13 is a diagram illustrating charge levels in a multi-level cell memory operated to store three bits of data in a memory cell.

FIG. 13 is a diagram illustrating charge levels in a multi-level cell memory operated to store three bits of data in a memory cell. FIG. 13 illustrates MLC memory with three bits of data which are stored in a single cell by establishing eight states or voltage level distinctions. This memory may be referred to as X3 memory. FIG. 13 illustrates the stages that may be used for programming three bit memory. In a first stage, the voltage levels are divided out at two levels, and at the second stage (i.e. foggy program), those two levels are divided up into the eight states without setting the distinct levels between states. At the third stage (i.e. fine program), the voltage levels for each of the eight states are separated and distinct. The fine programming establishes the voltage levels for each of the states. As compared with two bit memory, the three bit memory in FIG. 13 requires more exact programming voltages to avoid errors. Electron movement or loss from the charge values may result in problems. Endurance and programming speed may decrease based on the exact programming that is required.

In alternative embodiments, there may be memory schemes with increased bits per cell (e.g. 4 bits per cell or X4 memory). Each of those memory schemes may operate using that number of bits per cell (e.g. "n" bits per cell where n is an integer of 2 or more), but also by using SLC programming. Accordingly, the system and methods described herein will allow operation under n bits per cell or using SLC programming to act like a different bit per cell memory (e.g. any number less than n).

Figure 24:
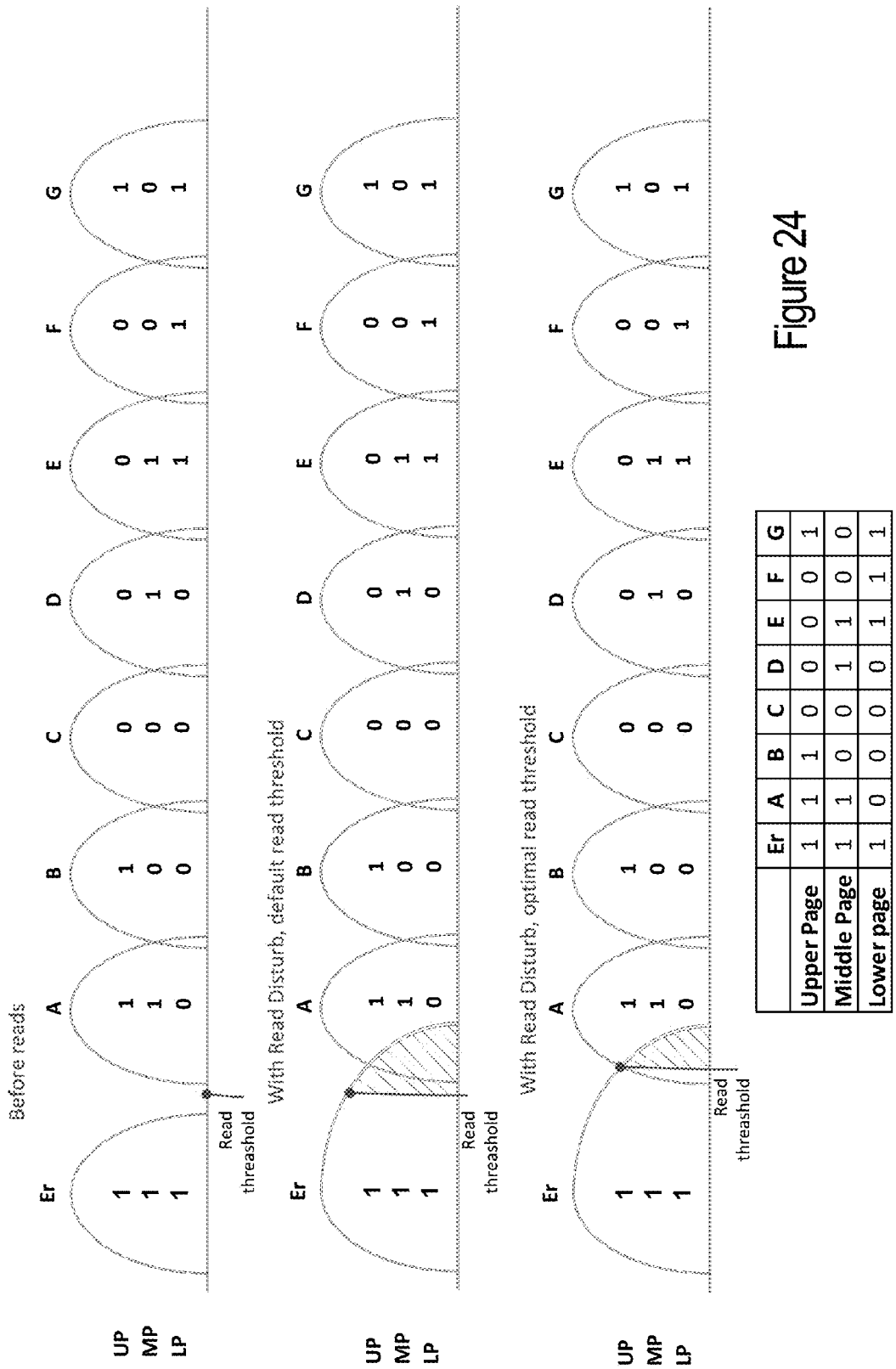
FIG. 24 illustrates read disturb effects on voltage states with changes in the read threshold.

The memory analytics described below captures data from analyzing multiple states. For example, in FIG. 13, states (A through G) may be analyzed. In one embodiment, the upper tail of the erase (Er) state (the main body of which is below 0V and may not be characterizable. Tracking multiple states plus the Er tail may provide the best signal to noise ratio. The system could (for reasons of simplicity or to reduce the amount of data being tracked) track data from less than the full number of states. In the case of the state shifting due to retention loss, the magnitude may be greater on the upper states. It might be more advantageous to simply track upper states or just one, for example, the G state (as shown in FIGS. 15-18). Further, FIG. 24 illustrates the states with differing thresholds. The decision as to which state(s) to track may be made according to which give the best signal of the parameter being tracked.

Figure 14:
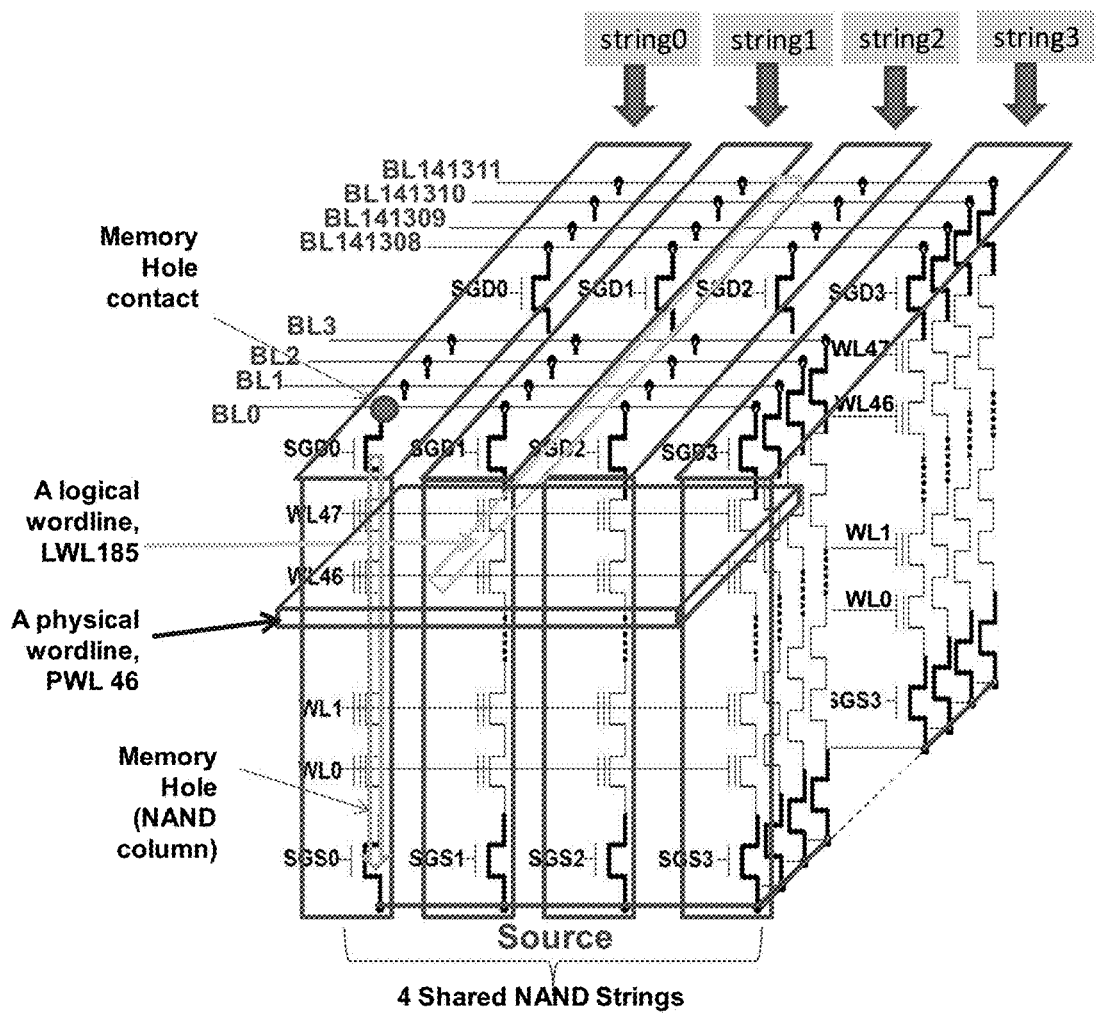
FIG. 14 is an exemplary physical memory organization of a memory block.

FIG. 14 is an illustration of an exemplary three-dimensional (3D) memory structure. FIG. 14 illustrates an exemplary 3D NAND flash with Bit Cost Scaling (BiCS) using charge trapping memory. The source lines and bit lines are further described an illustrated with respect to FIG. 15. The flash memory used in the storage system may be flash memory of 3D NAND architecture, where the programming is achieved through Fowler-Nordheim of the electron into the charge trapping layer (CTL). Erase may be achieved by using a hole injection into the CTL to neutralize the electrons, via physical mechanism such as gate induced drain leakage (GIDL). FIG. 14 is an exemplary 3D structure with each cell being represented by a memory transistor forming a memory column vertically (e.g., 48 wordlines). The wordlines (WL), bitlines (BL), and string number are shown in FIG. 6. Four exemplary strings are shown. There may be a memory hole (within a NAND column) that includes a memory hole contact. One exemplary wordline (logical wordline LWL 185) is illustrated along with an exemplary physical wordline (PWL 46).

Figure 15:
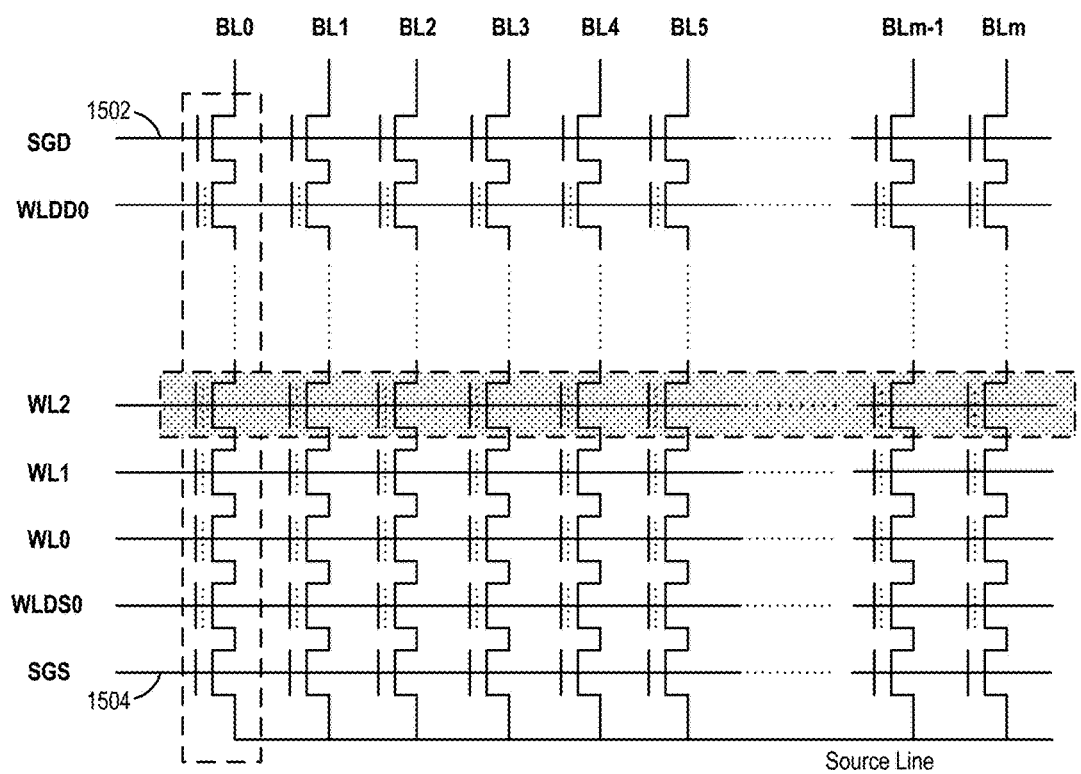
FIG. 15 is an illustration of an exemplary three-dimensional (3D) memory structure.

FIG. 15 is an exemplary physical memory organization of a memory block. FIG. 15 illustrates a page of memory cells, organized for example in the NAND configuration, being sensed or programmed in parallel. A bank of NAND chains are shown in the exemplary memory. A page may be any group of memory cells enabled to be sensed or programmed in parallel. The page is enabled by the control gates of the cells of the page connected in common to a wordline and each cell accessible by a sensing circuit accessible via a bit line (bit lines BL0-BLm). As an example, when respectively sensing or programming the page of cells, a sensing voltage or a programming voltage is respectively applied to a common word line (e.g. WL2) together with appropriate voltages on the bit lines. A silica gate drain (SGD) 1502 is shown opposite from a decoding gate, such as silica gate source (SGS) 1504. SGS 1504 may also be referred to as the source gate or source, while SGD 1502 may be referred to as the drain gate or drain. Word lines may be the unit by which memory analytics are performed.

The memory analytics described herein may be utilized at different levels including at the block level, metablock level, super block level, die level, wordline level, page level, etc. The memory analytics measurements and analysis may be described herein at the block level, but that is merely exemplary.

Figure 16:
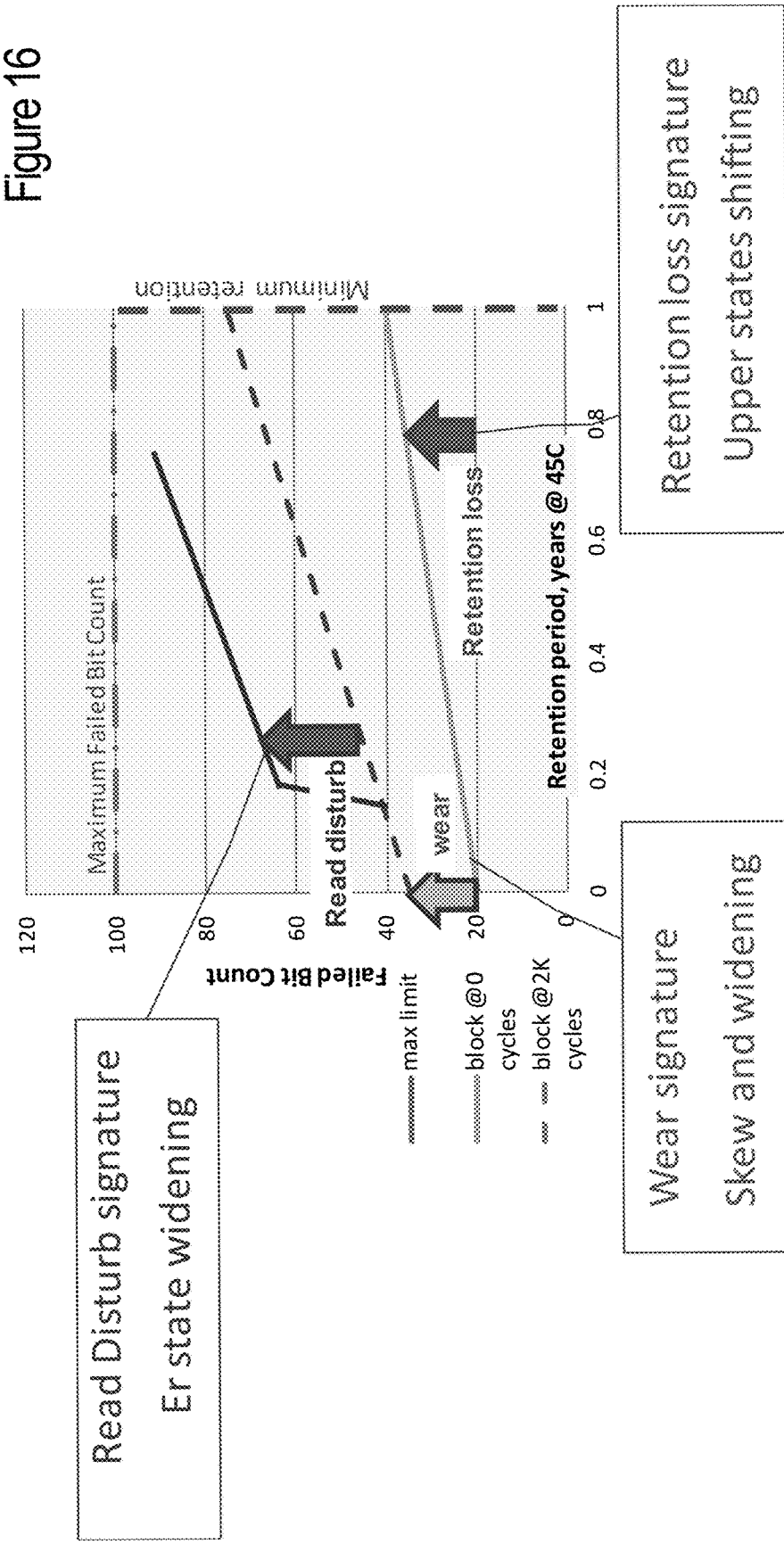
FIG. 16 is an exemplary illustration of errors due to read disturb, wear, and/or retention loss.

FIG. 16 is an exemplary illustration of errors due to read disturb, wear, and/or retention loss. Retention loss may be when the charge in a cell is lost which causes a bit error by a change in value of the cell. As shown in the diagram, the retention loss increases over time. The signature of retention loss is a shift in the upper states. Wear is the excessive usage of cells which may also result in errors. The signature of wear is a skewing or widening of voltage states.

Read disturb errors may be caused when cells in a memory block change due to interference from the reading of other cells in the vicinity. It may be due to a particular cell being excessively read which may cause the read disturb error for neighboring cells. In particular, a cell that is not being read, but receives elevated voltage stress because a neighboring cell is being read. Charge may collect on floating gates, which may cause a cell to appear to be programmed. In alternative embodiments, the memory may not use floating gates. For example, 3D memory may be a charge trap rather than a floating gate. The read disturb error may result in a data loss. Read disturb is shown with an elevated bit count. The signature of read disturb is a widening of the error (Er) state and possible widening of lower programmed states (e.g. A state).

Figure 17:
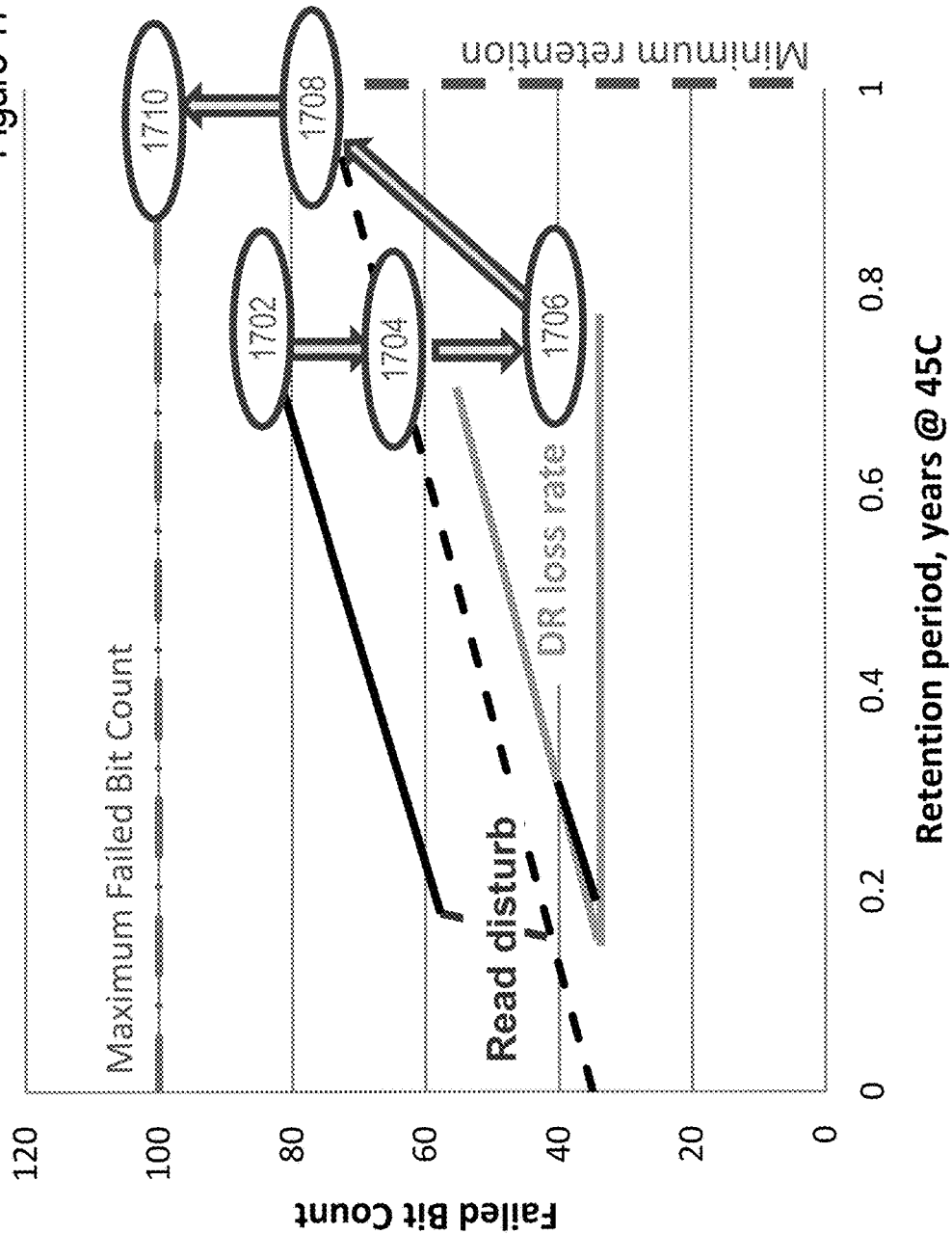
FIG. 17 is another exemplary illustration of errors due to read disturb, wear, and/or retention loss.

FIG. 17 is another exemplary illustration of errors due to read disturb, wear, and/or retention loss. FIG. 17 is further described below with reference to the bit error rate (BER) process due to the overlapped state but is applicable to the histogram process described herein. FIG. 17 may be an illustration of data retention loss rate tracking.

The memory analytics described herein address each of these conditions and account for them. In one embodiment, utilization of their respective signatures may be used for identification and measurement of individual contributing factors that lead to data errors. In one embodiment, the signatures of the read disturb, data retention, and wear may be used with a histogram analysis. In another embodiment, a bit error rate (BER) analysis of the slopes of the BER may be utilized for the memory analytics. The BER analysis is further described below with respect to the Error Rate Based Tracking shown in FIGS. 25-29. The goal of the memory analytics may include a more complete understanding of the state of the memory which may be achieved by looking at more discrete units of the memory (e.g. the block level or other levels).

Memory systems undergo write/erase operations due to both host writes and the memory maintenance operations in the normal life span of its application. The internal memory maintenance (i.e. non-host write operations or background operations) can introduce a high write amplification factor ("WAF") for both MLC and SLC. WAF may be the amount of data a flash controller has to write in relation to the amount of data that the host controller wants to write (due to any internal copying of data from one block to another block). In other words, WAF is the ratio of non-host write operations compared with writes from the host. In one example, up to half of the MLC write/erase operations may be due to these internal memory operations. This may have a significant effect on the life of the card. Accordingly, it may be important to reduce the endurance impact due to a system's internal write/erase operations.

Memory maintenance (which is interchangeably referred to as non-host writes and/or background operations) may be performed only at optimal times. One example of memory maintenance includes garbage collection which may be needed to aggregate obsolete data together in blocks to be erased. Garbage collection can group together valid data and group obsolete data. When a block includes only obsolete data, it can be erased so that new data can be written to that block. Garbage collection is used to maximize storage in blocks by minimizing the number of partially used blocks. In other words, garbage collection may be a consolidation or aggregation of valid data from blocks that have a mixture valid data and obsolete data that results in more free blocks since there are fewer blocks that have a mixture of both valid and obsolete data. The background operations may further include the measurement of cell voltages and/or the analysis of those voltages to independently identify data retention or memory wear issues as discussed below.

Figure 18:
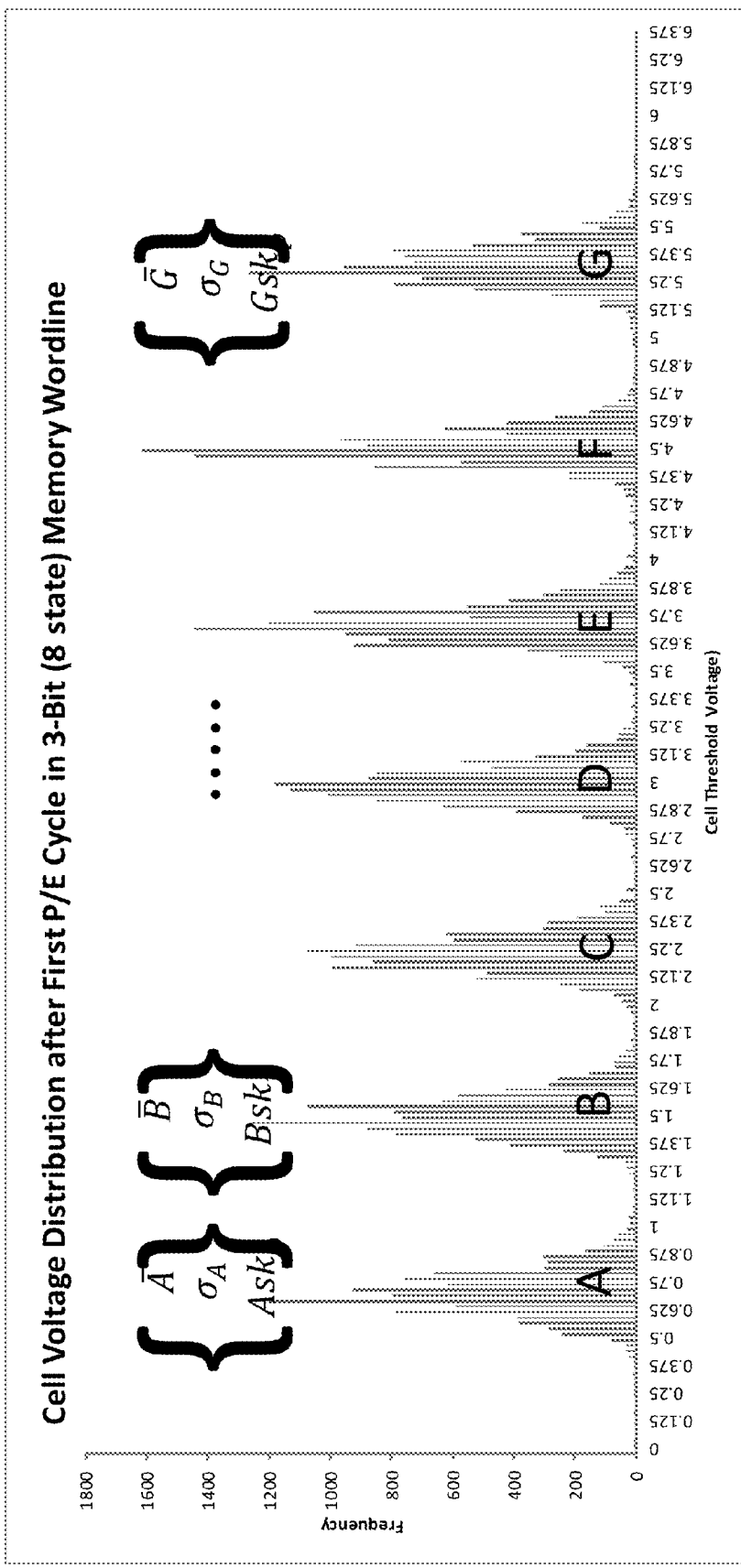
FIG. 18 is a histogram of exemplary cell voltage distribution states in a three bit memory wordline after the first program/erase cycle.

FIG. 18 is a histogram of exemplary cell voltage distribution states in a three bit memory wordline after the first program/erase (P/E) cycle. There are eight states associated with three bit memory (X3). Different memory (X2 memory with two bits and four states) may be analyzed similarly to the example shown in FIG. 18. The distribution of those eight states is shown in FIG. 18 after the first P/E cycle. This raw data may be collected by sending a set of sequences to the flash memory a "Distribution Read" sequence. The raw Distribution Read data is then processed to produce a histogram of the voltage levels in all the cells in the population. When the memory is described as having a certain wear or data retention loss, the reference to memory generally may refer to finite portions of the memory, such as block level, groups of blocks (e.g. the groups described with respect to FIGS. 9-10), page, plane, die, or product level. An exemplary population to obtain a flash memory unit (FMU), which may be statistically sufficient for the analysis and calculation describe herein. The FMU may be the smallest data chunk that the host can use to read or write to the flash memory. Each page may have a certain number of FMUs.

Once the histogram is obtained, the individual state distributions may be analyzed and characterized for: 1) Location; 2) Scale; and 3) Shape. For each of the eight states, the location, scale, and shape may be determined. A set of meta-data parameters (e.g. location, scale, shape) may be produced for the population. The meta-data may be used in either relative or absolute computations to determine the wear and retention properties of the population.

Location may refer to the location of the distribution may include some form of a linear average, such as the mean or mode. As shown in FIG. 18, the location is determined with the mean in one embodiment. Location may be calculated with other metrics in different embodiments.

Scale may include a measurement for the width of the distribution. In one embodiment, scale may be measured by a deviation such as the standard deviation, which is shown as sigma ($\sigma$) for each state. In alternative embodiments, a percentile measurement may be used (e.g. width of 99% of values). Scale may be measured with other metrics that quantify the width of the distribution in different embodiments.

Shape may include the skewness of the distribution. The skewness may be measured by asymmetry. In one embodiment, asymmetry may be determined with Pearson's Shape Parameter. Pearson's is merely one example of asymmetry measurement and other examples are possible.

The controller 118 may include a measurement module that measures the cell voltage distribution for cells for generating a histogram such as the example shown in FIG. 18. The controller may issue special read commands to the flash memory. In particular, the special read commands that are used to generate the histogram are gradually moving from zero volts up to a threshold voltage value. In other words, the controller sends special read commands to the NAND and the results are provided back to the controller. The special read command may a voltage signal that is gradually increased (e.g. 0 to 6 Volts, increased by 0.025 Volts for each signal as in the example of FIG. 18). This may be referred to as ramp sensing. The results at the controller are those cells that sensed to one. The initial measurement could be at manufacture and/or after the first programming and results in the reference cell voltage distribution that is used for comparing with subsequent measurements for quantifying the changes in distribution.

In the example of FIG. 18, the voltage value is gradually increased from zero volts to above six volts with a step size of 0.025 volts. The voltage is increased by 0.025 volts for each step and the number of cells that are changed in value (e.g. sensed from zero to one) is measured for the histogram. Starting at zero volts, all the program cells are above zero, so the result at zero is a frequency of zero. Moving up a step (e.g. 0.025 volts or another voltage step), the cells are again read. Eventually, there is a voltage threshold (e.g. as part of the A state) where there are cells that are programmed at that voltage. At any given cell threshold voltage (x-axis of the histogram) certain cells are sensed and that frequency is measured (y-axis of the histogram). Each value for the cell threshold voltage may be viewed as a bin of voltage values. For example at 0.6 Volts, the frequency being shown is really those cells that are sensed between 0.6 V and 0.625 V (where the step size is 0.025 V). The difference between cells below (value of 0=below) at 0.6 V from cells above at 0.625 V is the frequency. In other words, the voltage distribution may be the distribution of cells within a step size (e.g. 25 mV steps) that were triggered above the higher value of the step size (minus the cells triggered at the lower value of the step size).

Figure 21:
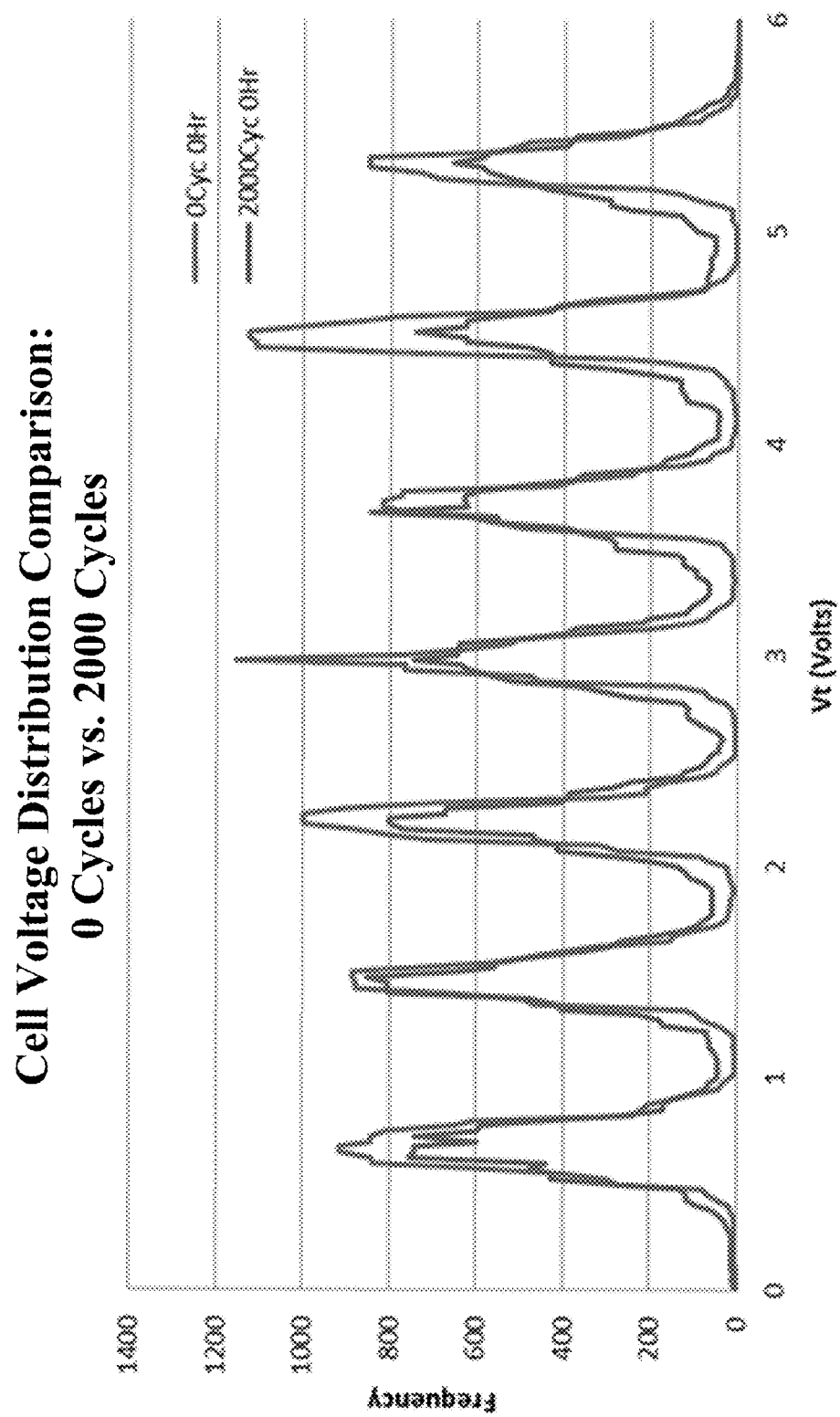
FIG. 21 is a cell voltage distribution illustrating distribution width and shape changes.

The absolute values from the histogram may be used for identifying parameters (e.g. wear, data retention, etc.). Alternatively, the histogram generation may occur periodically and the relative positions for the histogram may be used for identifying those parameters. In one embodiment, the periodic measurements may be based on timing (e.g. hours, days, weeks, etc.) or may be based on events (e.g. during background operations). FIG. 21 (described below) illustrates widening due to wear. Although not shown, the histogram may change after more P/E cycles. FIGS. 7-8 illustrate the cell voltage distribution of the 8 states (A-G) of the 3-bit (X3) memory. In alternative embodiments, there may be more or fewer states depending on the memory. The distribution calculations described herein can apply to a memory with any number of states.

Figure 19:
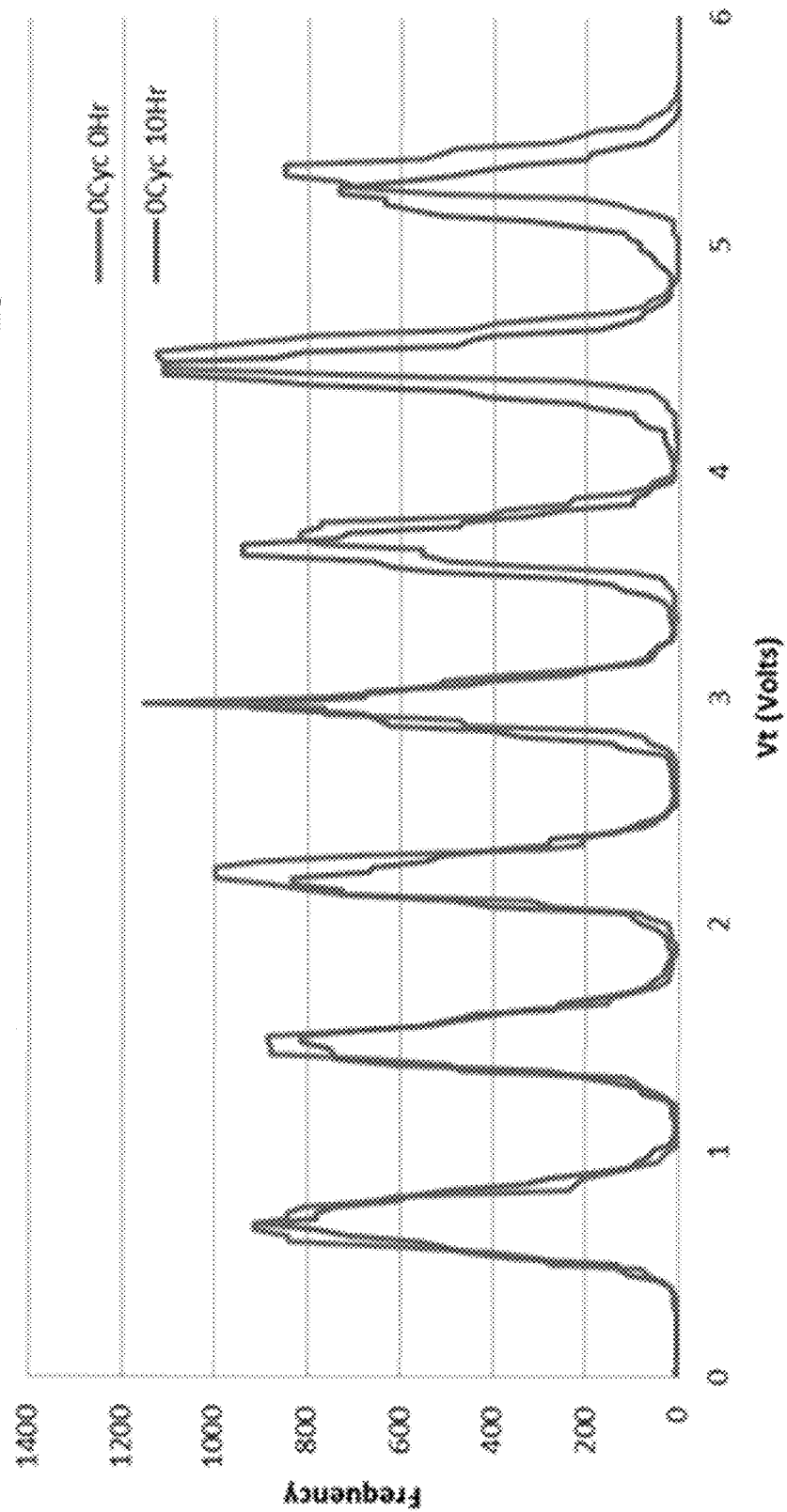
FIG. 19 is a cell voltage distribution illustrating location shift.

FIG. 19 is a cell voltage distribution illustrating distribution shift. FIG. 19 illustrates one distribution with no bake time (0 hour bake time) and one distribution after being baked for ten hours (10 hour bake time). The baking process includes exposing the memory to a very high temperature over a short time to simulate exposure at a normal temperature over a much longer time. Over time, data may be lost from the memory (even at normal temperatures) and the baking provides a mechanism for testing this data loss in a shorter amount of time (e.g. 10 hours of bake time rather than years of time at a normal temperature). Even at normal temperatures, electrons may leak from the floating gates over time, but the baking process just speeds up that leakage for testing purposes.

FIG. 19 illustrates that the data loss (i.e. poor data retention) results in a gradual shift of the distribution. In particular, FIG. 19 is an illustration of analysis of data retention (DR). The right most distributions (i.e. the E, F, and G distributions) have a downward (lower voltage) shift due to the lapse in time (simulated by bake time). In the embodiment of FIG. 19, this is performed with a minimal amount of P/E cycles (indicated as 0Cyc in the legend) so that wear will not influence the calculations. In other words, the memory wear is isolated from the data retention parameter because only fresh blocks are being baked. The result is a distribution that has no change to scale or shape, but does have a location change. Accordingly, a location shift of the distribution is indicative of a data retention problem.

Upper State Tracking

Upper state tracking may be a subset of the previous embodiments or it may be a separate method used for tracking all states or for read disturb (RD) signature removal. In one embodiment, the tracking of an upper state may be used for memory analytics. This analysis may be part of an analysis of cell voltage distribution. In particular, the upper state tracking may utilize only an upper state for the memory analytics where a cell voltage distribution of one or more of the upper states may be representative of the memory as a whole. For example, referring to FIG. 13, the G state may be used for this purpose and the tracking may be referred to as G state tracking. FIGS. 20-23 may include an illustration of G state cell voltage distribution.

Figure 20:
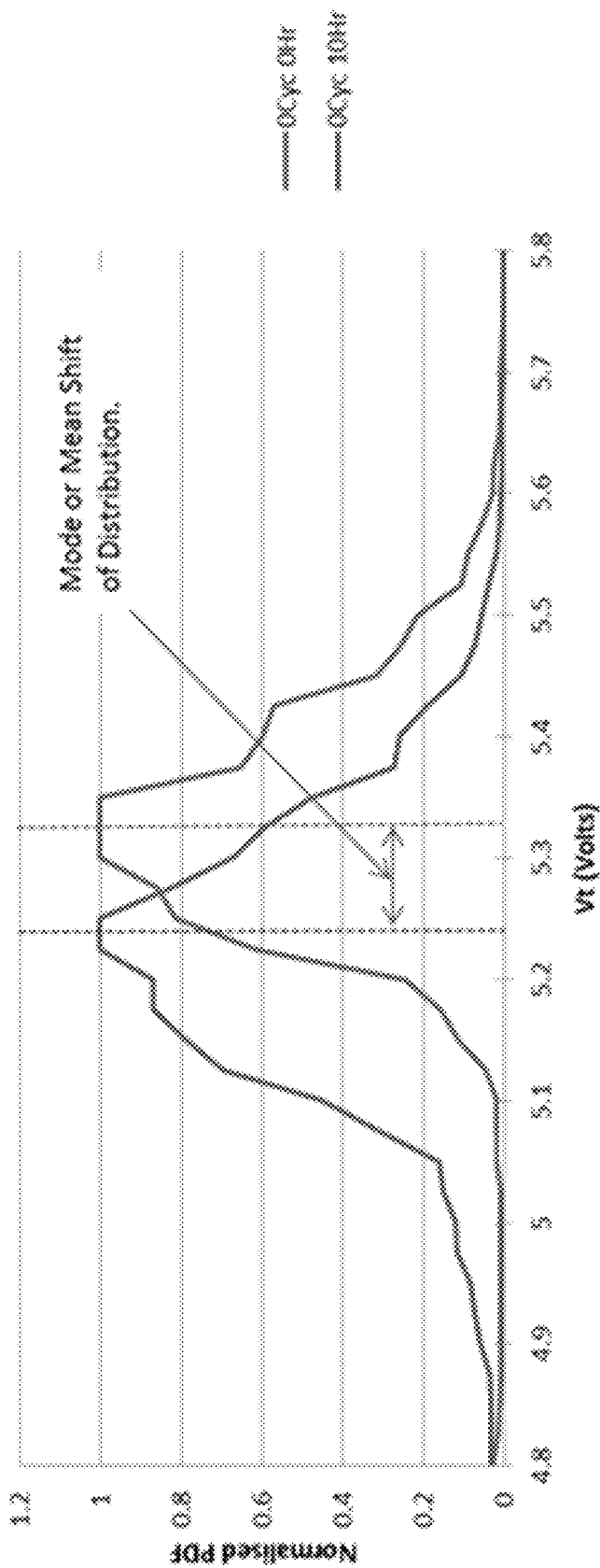
FIG. 20 is an expanded version of the G state cell voltage location shift.

FIG. 20 is an expanded version of the G state cell voltage distribution shift. In particular, FIG. 10 illustrates the G state (the highest voltage state) from FIG. 19 with a normalized y-axis (frequency maximums from FIG. 19 are normalized by peak value to one). The two lines shown are one with no bake time (0 Hr) and a distribution after a ten hour bake time (10 Hr). The distribution shift is more clearly shown in FIG. 20 and may be referred to as the location. The location may be calculated as the difference in the shift of the modes between the two distributions or the difference in the shift of the means between the two distributions. In this embodiment, only the G state is examined because the largest (and easiest to measure) shift occurs in the G state. In alternative embodiments, the shifts of any combination of the other states may also be measured and used for calculating data retention problems. For example, shifts from different states could be combined and the average or gradient information for those shifts may be analyzed. The gradient of the relative shifts of different distributions may provide information for the location.

Figure 22:
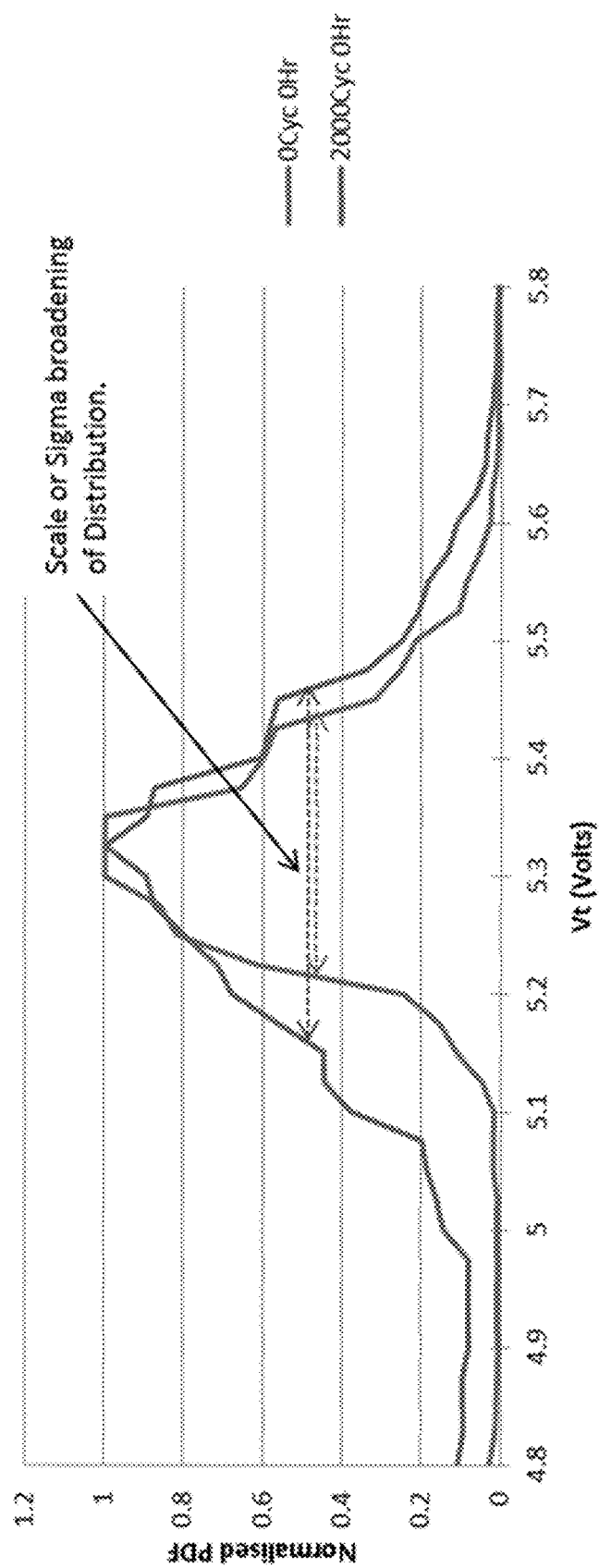
FIG. 22 is an expanded version of the G state cell voltage distribution scale changes.

While a shift of the cell voltage distribution may be indicative of data retention, a change in shape of the cell voltage distribution may be indicative of wear. FIG. 21 is a cell voltage distribution illustrating distribution scale and shape changes. FIG. 21 illustrates a distribution with limited usage (0 Cyc=no/limited P/E cycles) and a distribution with high usage (2000 Cyc=2000 P/E cycles). Unlike in FIGS. 19-20 there is no bake time (simulating elapsed time) for this distribution because it only illustrates changes caused by P/E cycles. FIG. 21 illustrates that the both the scale/width and shape of the distribution are changed by wear. In other words, the scale/width and shape change of a distribution are indicative of wear. FIG. 22 describes using cell voltage distribution width for determining wear and FIG. 23 describes using cell voltage distribution shape for determining wear.

FIG. 22 is an expanded version of the G state cell voltage distribution scale changes. Wear results in a widening of the scale of the distribution. Accordingly, a quantification of the shape widening can be indicative of wear. In one embodiment, the width may be quantified using the standard deviation of the distribution. Alternatively, percentiles of the scale may also be used. For example, FIG. 22 illustrates (with the dotted line widths) an exemplary 50% point on the distribution and a determination may be made as to where it crosses the x-axis. In other words, a comparison of the lengths of the two dotted lines in FIG. 22 is an exemplary value for the scale/width.

Figure 23:
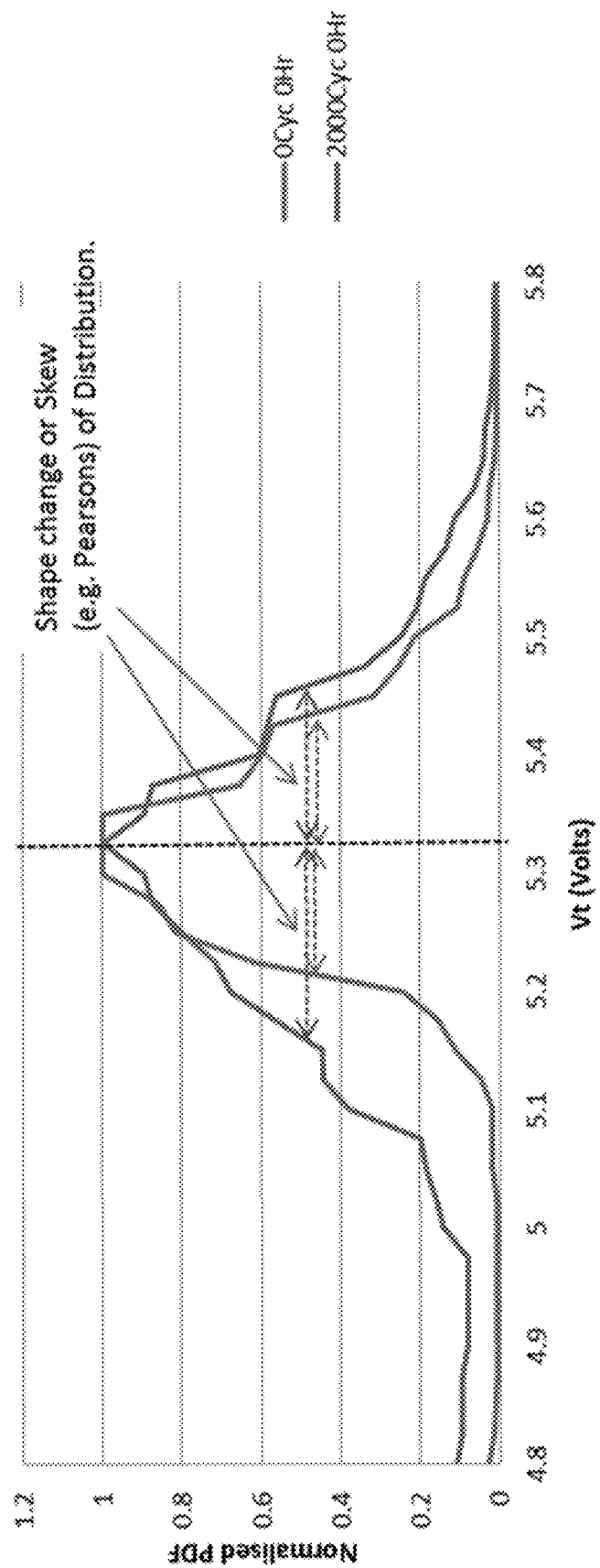
FIG. 23 is an expanded version of the G state cell voltage distribution shape changes.

FIG. 23 is an expanded version of the G state cell voltage distribution shape changes. As an alternative to scale/width measurements of the changes to the distribution, the shape/asymmetry/skewness of the distribution may be analyzed for the wear analysis. As discussed, Pearson's Shape Parameter is one exemplary way to measure asymmetry. The shape changes to the distribution as a result of wear may modify the distribution as shown in FIG. 23. The G-state can be used to exclude the RD component, instead of using RD margin for end of life (EOL) and/or other estimates. Other states (e.g. E or F), or combinations of states, may be more representative for wear and DR measurements. G-state is merely one example for this measurement.

As with FIG. 20, both FIG. 22 and FIG. 23 are normalized with the respect to the y-axis based on each distribution's respective peak value. Since only the voltage value (x-axis) matters for the quantization of any of the location, scale, or shape, the y-axis values do not matter. Accordingly, the normalization of the y-axis does not affect the voltage values, and does not affect the quantization of the location, scale, and shape.

Wear and retention loss are independent variables using this cell voltage distribution analysis. In particular, an analysis of the cell voltage distribution of the memory can be used to independently quantize wear, or may be used to independently quantize retention loss. Increased wear does not affect retention loss, and retention loss does not affect wear. In other words, when cells wear, the cell voltage distribution widens and changes shape, but the location does not change. Likewise, when data retention worsens, the cell voltage distribution shifts location, but the width and shape of the distribution do not change. Merely determining BER as an indicator of either wear or retention loss does not allow for identifying either parameter independently. However, a determination of BER with read thresholds may be used to measure shift and widening, as indicators for wear and/or DR. This determination is further described below. Skew may be hard to measure but can be approximated using pre-measured data.

The measurements and generation of the histogram values may be a controller intensive process that is run only as a background operation to minimize performance issues for the user. In one embodiment, the measurement and collection of the histogram data may be stored in hardware, such as in firmware of the device. Likewise, hardware may also perform the analyzing (e.g. calculation and comparison of location, scale, shape, etc.) of the histogram described herein. There may be a component or module (e.g. in the controller or coupled with the controller) that monitors the distribution changes (location shifts, and width or shape changes) of the cell voltage distribution to identify or predict data retention or wear problems. In one embodiment, this may be part of a scan that is specific for either data retention loss or wear. Alternatively, the scan may be associated with a garbage collection operation. A periodic measurement of the cell voltage distribution can be made and stored. That data may be periodically analyzed to identify wear (using either width or shape distribution changes) or retention loss (using location distribution changes).

End of Life Prediction Based on Memory Wear

The data loss (retention) and/or memory wear that are independently determined may be used for predicting the life remaining in the system. The end of live (EOL) prediction may be based on the memory analytics using histograms above. Alternatively, the EOL prediction may be based on the bit error rate (BER) method described below.

System life may be predicted by the lifetime of the worst X blocks in the system. X may be the number of spare blocks required for operation. If the wear remaining of all blocks in the system is ordered from lowest wear remaining to highest wear remaining, then system life may be predicted by the wear remaining of the Xth ordered block. The Xth ordered block may be the measure for the system life because when all the blocks up to and including this block are retired, then the system may cease functioning Specifically, if there are no spare blocks remaining, then the system may transition to read only mode and may not accept new data.

In one embodiment, FIG. 17 may be an end-of-life calculation. Block 1704 may measure DR loss utilizing memory analytics. In block 1706, DR loss rate is calculated and in block 1708, the current BER is estimated at end-ofretention margin. In block 1710, the end-of-retention prediction is updated along with the block's maximum P/E value.

The system life calculation may be utilized with any method which calculates wear remaining of individual blocks. As described above, the wear remaining is calculated independently by analysis of the cell voltage distribution. Other embodiments, may calculate wear remaining of the individual blocks through other methods. The system life may still be estimated based on the wear remaining of the block that is the Xth most worn, where X is total number of spare blocks required. Accordingly, the independent calculation of wear remaining discussed above may merely be one embodiment utilized for this calculation of overall system life.

The data loss (retention) and/or memory wear that are independently determined may be used for determining which blocks to select for reclamation and subsequent use for new host data. As discussed above, hot count may not be an accurate reflection of true wear on a block. Cycling blocks using the actual wear remaining calculated for each of the blocks may be more accurate. The system endurance may be extended to the average wear remaining of all blocks in the system. This increases system endurance over the system endurance that relies on hot count wear leveling. The blocks are cycled in an attempt to level the wear remaining for each block. In particular, blocks with the lowest wear remaining may be avoided, while blocks with the most wear remaining may be utilized in order to normalize the wear remaining. This wear leveling may extend the life of the device by avoiding the blocks with the least wear remaining, which prevents them from going bad and being unusable.

A calculation of actual wear remaining for each block allows for each block to be leveled based on actual wear rather than based on the hot count (which may not reflect actual wear remaining). The actual wear may be the error rate or bit error rate. Further, program/erase (P/E) failure probability may be a symptom of actual wear. Measuring wear rate (which may define BER rate due to P/E cycles) may be better than using a large margin assuming every block is as bad as the worst one in the population. In other words, the worst may be the one with the least number of P/E cycles before maximum BER at maximum retention. This may also apply to DR loss rate. Any method for individually determining the wear remaining for individual blocks may be utilized for this wear leveling, including the calculation of wear remaining by analysis of the cell voltage distribution described above. More accurate wear leveling increases overall system endurance because the system endurance becomes the average capability of all blocks in the system.

Data loss prediction can be improved by predicting or estimating elapsed time and/or temperature changes. Charge may dissipate over time or at higher temperatures, resulting in a potential data loss if a cell crosses a threshold. Predicting when this may occur can allow for data to be scheduled to be refreshed before it is lost, but not so frequently that it would cause unnecessary wear. Knowing the retention time remaining for the data in each block in the system can be used for identifying which blocks are in need of being refreshed as compared with other blocks and can be used for identifying which blocks must be refreshed in order to avoid a loss of the data. Previous approaches may have used assumptions for rate loss that is based on a worst case scenario. Having the data loss prediction or data retention information for each block allows for a more accurate estimate of overall data loss and more efficiency in refreshing blocks.

Retention loss rate may be measured by making periodic measurements of the cell voltage distribution as described above, and computing the rate of change in units common to all blocks in the system. Once an accurate retention loss rate is determined for all blocks in the system, the zero-time retention capability of all blocks can be computed. Blocks can then be retired or used for purposes other than long-term data retention based on their retention capability (e.g. if retention capability falls below that value required to meet warranty requirements). At any time, the retention life remaining of all data stored in the device may be compared and provided in response to a system query. This may be useful for archival situations where the device is periodically powered up and the life remaining of the data stored within the device must be accurately known.

Memory Block Cycling

The memory block cycling may be a wear leveling method based on the EOL prediction described above. The data loss (retention) and/or memory wear that are independently determined may be used for determining which blocks to select for reclamation and subsequent use for new host data. Cycling blocks using the actual data loss (retention rate/margin) calculated for each of the blocks may be more accurate than relying on hot count for block cycling. The system endurance and retention capability may be extended to the average retention margin remaining of all blocks in the system. The blocks are cycled in an attempt to prevent data loss for each block. In particular, blocks with the lowest data retention levels or data retention rates may be selected for reclamation and subsequent use, while blocks with the best data retention may not need to be cycled/refreshed. This may normalize the data retention rates of all blocks. This cycling of blocks may extend the life of the device by refreshing blocks with data retention issues, or even cycling out any blocks with poor data retention that cannot be fixed with refreshing. In one embodiment, blocks with a higher data retention rate may be used for longer term data, while blocks with a lower data retention rate may be used for shorter term data. This may be to divert data traffic which triggers more garbage collections and P/E cycles, to those blocks which can handle more P/E cycles. Also, it helps to reduce DR triggered copies, as described below. Likewise, the blocks with a higher data retention rate may be used for more important data. For example, the better blocks may be used for control information and address tables.

A calculation of data retention for each block allows for each block to be cycled based on actual data retention rather than based on the hot count (which may not reflect actual data retention). Any method for individually determining the data retention for individual blocks may be utilized for this cycling, including the calculation of data retention by analysis of the cell voltage distribution described above. More accurate data retention cycling increases overall system data retention capability because the system data retention capability becomes the average capability of all blocks in the system.

Optimization between performance and endurance may be achieved using values for memory wear value from each of the blocks. The program speed (or harshness), which as an example can be effected by the width in time of programming pulses and the voltage magnitude of programming pulses, for each block may be set to achieve a specific wear rate (endurance capability). The higher the program speed, the more the memory cells will be worn but the program time will be lower leading to higher performance. In this way there a fundamental programmable trade-off between wear and performance that can be achieved. By combining raw measurements of block performance capability (time to erase/time to program) with the wear or retention of each block, the program rate for each block can be set optimally which results in a distribution of program times that are individually tuned for each block to maximize the endurance for a given minimum performance. For example, a lower program rate provides decreased performance, but increased endurance. Likewise, a higher program (programming faster) provides better performance, but risks reduced endurance/lifetime. Because the wear and data retention are known for individual blocks, the program rate for those blocks may be independently modified. In other words, the optimization may be made on a block-by-block basis. Blocks with high wear may be programmed slower than blocks with low wear. Likewise, blocks with poor data retention may be programmed slower than blocks with good data retention.

Endurance may be maximized to increase the device lifetime. Alternatively, performance may be maximized for all blocks in the system to satisfy a given minimum block endurance requirement. This performance/endurance optimization may be made and adjusted during run time of the device. In particular, the wear rate and data retention for each block can be updated periodically, so those updated values can be used to update the optimization. In one embodiment, the user may adjust the trade-off between performance and endurance. This dynamic adjustment that optimizes between performance and endurance, which results in a more customizable device.

An accurate measurement of the data retention loss (i.e. temperature accelerated stress time) may be made due to time/temperature while a device was switched off. The precise temperature accelerated stress time of the power-off period is predicted and may be used to re-compute the age of all data in the system. Upon power up, the data retention loss (i.e. retention margin) may be re-measured for each block. The values for data retention loss may be compared to the trend predicted by previous measurements. As described above, the data retention (or wear) for individual blocks may be periodically measured and a rate of change may be calculated. This change or trend may be compared with the values after power up. Changes to the trend may be due to a long power-off period or higher temperature during the power-off period and may have a cumulative negative effect on the device. The effective temperature accelerated stress time during a power-off period may be computed based on the trend changes. Accurate temperature accelerated stress time estimates can be used to re-compute the age or retention life remaining of all data stored in the system. Changes to the wear or data retention between power off and power on can be used to estimate the temperature accelerated stress time for any power off period based on changes to the wear and/or data retention upon power up, after that power off period. Knowledge of the wear and/or data retention for each individual block may allow for a more accurate estimate of temperature accelerated stress time than would otherwise be estimated using BER. Because the changes in those values are periodically measured, all systems that rely on such data will have up to date information and corresponding actions can be taken.

Applications such as wear levelling and prediction of end of life or certain error rate in the future may all be temperature dependant. Therefore, the predictions and estimates may be temperature dependent. For example, if end of life is determined by the event of reaching maximum number of errors after the minimum retention period, the $n^{th}$ worst case scenario should be considered for the temperature mode. The measurements of data retention loss rate may also be dependent on temperature accelerated time, rather than absolute time. Effects of wear, DR, and RD as measured (e.g. number of errors) may depend on the current temperature. The measurements of absolute values, change rates and predictions as explained in the examples only makes sense if the temperature is the same. If it is not, then the correction has to be made to adjust the values to the current temperature (for absolute measurements) and to the temperature accelerated time (for change rate), and adjusted for specific temperature mode (for predictions).

NAND Flash memory may traditionally utilize static trim parameters, using the same programming mode for the same product. A trim parameter may include one or more parameters related to read operations, including a program rate, a program voltage level, a step-up voltage or step size, and/or a program pulse width. For example, the trim settings may include a sensing time or sense amplifier delay, and/or a sensing or sense reference voltage. The initial setting of the trim parameters may be set up for the fastest and most aggressive programming mode possible within the endurance requirements for the worst block. However, a memory test at production may require extensive testing to make sure that all blocks marked as good meet the performance and endurance criteria. By utilizing independent measurements of wear and/or data retention rate for each individual block, the identification of good or bad blocks using trim parameters may be dynamic and may be more accurate. In particular, the individual measurements of data retention for each block may be tracked (i.e. current values compared with initial values of data retention). Combined with program and erase (P/E) time measurements, temperature accelerated stress time measurements, and block endurance estimates, outlier (potentially bad) blocks may be detected as having unacceptable performance or data retention values (either based on a current value or based on a predicted value using the tracked values). The detected blocks may then be mapped out as bad if they are below a threshold. The threshold may be based on the health of the other blocks (e.g. threshold must be X % of average health) or may be based on outlier blocks (health deviation from an average). Not only can this be performed on the block level, but it may also be performed on the word-line level.

By setting trim parameters statically (e.g. at manufacture), there may be unused margin in performance, endurance, and data retention. Dynamic block management (e.g. 604 in FIG. 6) may include leveling the usage of blocks and hot/cold data mapping, or modifying trim parameters independently and dynamically, and at the block level. The management may include narrowing and recovering the margin distribution and the extra margins trade-offs (e.g. 606 in FIG. 6) may include using recovered extra margins to trade off one aspect for another for additional benefits. A user may be able configure trade-offs, such as reduced performance for improved endurance.

Trade-offs that take advantage of unused, wasted margins of individual blocks may be made by the host and/or user. A host protocol may be set up externally with the trade-off bias. For example, there may be different use cases for the host/user to choose between (e.g. high/low power/performance, low/high endurance, low/high data retention). For example, in FIG. 5, the memory analytics user interface 502 may receive input from the host (through the front end 128) that is translated into system specific trade-off bias. The trade-off can be changed at production or during life via the host's interface. Examples of host/user controlled trade-off conditions (i.e. over-clocking) may include: 1) high-performance, standard endurance and retention; 2) high-performance, low endurance or/and retention; and/or 3) lower performance/power, high endurance and/or retention. These exemplary options may be selected dynamically by the user, or may be set at production in the factory.

Dynamically throttling down programming parameters to make programming more gentle may cause less wear, but at the cost of programming performance. This dynamic throttling may be utilized when a high level of wear is detected. Based on the measurements discuss above, wear may be calculated for individual blocks or other units of the memory. The high level of wear may be a threshold above which the memory is not designed to operate properly. The threshold may be set below this critical value at which a block becomes unusable. Performance throttling may then be triggered to extend endurance. Further, the trim parameters may be dynamically changed. As discussed above, the trim parameters may include one or more parameters related to read operations, including a program voltage, a step-up voltage, and/or a program pulse width. For example, higher endurance programming mode may be achieved by lowering the programming voltage with finer programming pulses. Likewise, for a higher data retention programming mode (in addition to lower wear mode), extra time may be sacrificed to allow a finer programming mode which can make voltage distributions tighter and margins wider. Tighter programming with wider margins may cost performance but improve data retention.

As with the dynamic throttling based on wear, the performance may also be throttled for a low power mode. A low power mode may also be a lower performance mode that is established by the device and/or host. In one embodiment, the detection includes receiving a host's command to go to low power mode, which allows for an operation at a lower speed. Alternatively, the device may detect a low battery level and automatically trigger the low power mode. In yet another alternative embodiment, a high temperature level may be detected which may require throttling down power to reduce heat dissipation. Accordingly, a detection of a lower power mode may be a signal to throttle performance (e.g. adjustment of trim parameters). For example, lower power programming mode may be achieved by lowering the programming voltage with finer programming pulses. Higher endurance programming mode or higher data retention performance mode may both utilize lower power than a higher performance mode.

Devices in normal use have frequent idle times which can be used for GC work by storage devices. Tasks during idle time may not be time critical, so modern devices utilize user idle time to undertake background work that they immediately suspend once the user becomes active. Such background work may compete against the device's need to perform pending GC work by sending commands to the storage device forcing it into a non-idle state. Reducing power consumption for the device while also increasing endurance can be achieved with the goal of having sufficient time for necessary background operations. Identification of when a command is due to a user idle background processes may allow the device to optimize itself to maximize endurance and reduce power use.

Programming may be adjusted dynamically for tasks which are not time critical. Just as there may be dynamic throttling for low power mode, there may also be throttling for tasks which are not time critical. The identification of a task which is not time critical may include detecting on the drive or sub-drive/bank level or it may be a host's triggered background or idle mode, or detection of an inactive part of a drive. It may be detected on a die level, and individual die may be idle if there is no pending host writes. In this example, a background task, such as Garbage Collection (GC), may be implemented with lower performance. Various trim parameters (discussed above) may be dynamically adjusted for tasks that are not time critical.

Exemplary non-critical tasks may include: 1) tasks in which there was no host command (e.g. background operations); 2) a command from the host that is identified as non-critical (e.g. iNAND products with commands from the operating system); or 3) through the identification of a low priority period. The identification of a low priority period may be identified by distinguishing between non-urgent "Low Priority Command Period" host activity and urgent "High Priority Command Period" host activity. By distinguishing between these, the endurance may be increased while also reducing power consumption of a device by distinguishing between active user time and background operating and file system commands sent to the device. Because low priority periods are identified separate from high priority periods, the performance may not suffer for this optimization. The following inputs may be used in order to identify low priority command periods:

Rate of read sectors from the device over time;
Rate of written sectors to the device over time;
Data rate (reads and writes) as a proportion of maximum drive data rate ability;
The time gap between commands being received from the host;
Pattern of writes to file system specific areas (e.g. NTFS recovery zones); and
Changes in depth of the device's Native Command Queue (NCQ).

Patterns in the rate of work performed by the device may be analyzed to identifier whether a particular task is not critical. For example, a device may be busy, but the data pushed/pulled may be low, so despite being busy, this may be a non-time critical activity (idle time) since the read/write activity is low. In particular, the read/write (R/W) data rate over time may used to identify idle time. A pattern of low data rate corresponds to a low priority command period. In other words, when the data rate is low it may identify an idle time regardless of how busy the device may be.

There may be a threshold value for the data rate per period of time. If the threshold value is exceeded, then the current period is not low priority. The threshold may be extended to longer or shorter periods for more accurate measurements (e.g. data rate per minute vs. data rate per second). If the threshold value is exceeded, then the data rate may be examined over a longer time period. In an alternative embodiment, there may be a native command queue. When the host commands queue is backed up, this indicates a higher priority time period. For example, this may trigger coming out of low priority mode.

Data rate may be used to identify a low priority command period (idle time) and non-critical tasks. Low data rate periods may be ideal times to undertake GC work. When low priority command periods are detected, the device may be optimized by:

Remaining in garbage collection mode even when new commands arrive from the host;

Having the ability to over-ride read priority during background work detected mode (speed of reads may be considered less important than getting garbage collection work completed);

Programming data more slowly to improve endurance;

Running transfer buses in low power mode (slower data rate);

Powering down dies and routing data to a single die (reduce parallelism); and

Reducing RAM use and powering down banks of RAM to reduce power use.

Error Rate Based Tracking

Wear can be identified and measured by its signature skew and widening of the program states. Similarly, data retention changes have a signature of upper states shifting down in voltage (left on the distribution diagram diagram). Also, the RD effect can be recognized. All three effects, wear, DR and RD contribute to read errors, as illustrated in FIG. 16. All three effects may be measured independently.

Characterizing the state histogram(s) for location, scale and shape and tracking this data over programming cycles and time may not be the only way to determine the amount of wear, retention loss or read disturb a unit of memory has experienced. Other methods may reduce the amount of histogram analysis by substituting inferred data from what is happening to the error rate under certain conditions. For example, to determine the amount that the erase state tail has shifted into the A-state (to separate read disturb), it may be possible to map the data after it has been corrected by the ECC engine from the state it was detected in to the state that it should have been.

The proposed failed bit count ("FBC") or error rate method may be based on the error rate measurement, approximated by taking multiple reads and measuring the FBC and by using the optimal read thresholds. FBC, as a single measure for a codeword or a page, may be extrapolated to the error rate for a wordline and block by taking multiple measurements of different pages and wordlines, in order to represent a large block and remove the noise.

The FBC process may include 1) RD FBC—which is equal to zero at zero retention time, as there were no reads; 2) DR FBC—also equal to zero at zero retention time, as there is no retention; and 3) Wear FBC—which is equal to total FBC at zero retention time, provided that the errors due to bad cells are not counted. The bad cells may be identified and counted at the beginning of life as static bad bits and removed from the analysis as they may not indicate error changes die to wear. In other words, Total FBC=Wear FBC (as additional total FBC@(retention time=0)–bad cell error count)+DR FBC (=additional FBC @time=current)+RD FBC (=additional FBC @time=current). This may allow for the separation of FBC due to wear versus FBC due to DR, provided RD errors are removed as described below for the error-rate RD signature removal.

FIG. 24 illustrates read disturb effects on voltage states with changes in the read threshold. In particular, FIG. 24 is a simplified version of overlaps, including the Er and A state overlap. In addition, there is an A to B shift due to read disturb (RD). Read disturb may prevent an accurate measurement of age or predicted lifetime of memory. Accordingly, an accurate assessment of lifetime may require a consideration of potential read disturb effects. In particular, the read disturb can shift the voltage states.

By counting the number of cells that were detected in the A-state but in fact were part of the erase state, the scale of the erase state distribution can be approximated. FIG. 24 illustrates the states before reads. With read disturb, the states shift. The middle diagram illustrates the default read threshold, which is the read threshold before any reads. Upon read disturb, the default read threshold may no longer match the shifted data as can be seen in the middle diagram where the default read threshold does not match the data. Optimizing the read threshold may include shifting the read threshold to an optimal value based on the shifted states. The optimal value of the read threshold may be the value at which the bit error rate (BER) is minimized. As shown in the diagrams, the area of the overlapped portion (diagonal lines) is minimized for the optimal read threshold. The overlapped portion may be quantified as the number of bit errors. The diagonally shaded area in the bottom diagram shows errors due to Er state widening to A state, and may not include errors due to A widening to Er state. In other words, the tail of the A state is left of the read threshold. The errors due to Er and A state overlap are made of two parts: 1) Er state overlap over the read threshold, so it is read as A state (LP bit flips from 1 to 0)—those errors are shown as diagonally shaded area; and 2) a state overlap over the read threshold, so it is read as Er state (LP bit flips from 0 to 1). Although those errors are not shown on the Figures, they would be on the area on the left of the read threshold line, as on the bottom diagram of FIG. 24. On the middle diagram, it does not exist, so in this example, there would be no overlap, as the read threshold is too low. The optimal threshold voltage is selected to minimise the total number of errors from 1) and 2) listed above.

The bottom diagram in FIG. 24 illustrates that the optimized read threshold is shifted to be between the A state and the Erase state. In alternative embodiments, each of the thresholds between each state may be optimized. Alternatively, a representative read threshold may be analyzed and movement of that threshold may be used to determine a corresponding movement of read thresholds for other states. Although this method minimizes number of errors overall and the amount of the state shift indicates severity of RD, it may be difficult to accurately separate errors which happened due to RD from the errors which are the result of Er-A and A-B overlaps due to wear and DR.

Removing Read Disturb Signatures

The use of bit error rates (BER) may replace the histogram analysis described above. In particular, the BER memory analysis may be used for read disturb (RD) signature removal. Separate measurements of BER may be used for Er, A, B states (i.e. read disturb sensitive) and higher states (states C . . . G). Also, the proposed method may allow for the distinguishing of Er state to A state errors from A state to Er state errors which may be part of the same overlap area. For example, one may use default read thresholds and one may use optimized read thresholds. Combined with the BER analysis the overlaps may be distinguished. Regardless of whether the read threshold is optimized, the BER may be used to measure data retention loss or read disturb. Another option may be to remove Er, A, B states from the overall BER analysis of wear and DR rates. An extreme case may be to use only the G-state. Overall BER may be approximated, as a more accurate indicator in a real drive that has minimal RD noise.

To determine an amount that the erase state tail has shifted into the A-state (to separate read disturb), the data may be mapped (after being corrected by the ECC engine) from the state it was detected in to the state that it should have been in. This quantization may be of the overlap shown in FIG. 24. By counting the number of cells that were detected in the A-state but in fact were part of the erase state, the scale of the erase state distribution can be approximated. For example, the LP 1 to 0 errors are where MP & UP=1 in the 2-3-2 encoding shown in the diagram.

Referring back to FIG. 17 which may include the bit error rate (BER) due to the overlapped state (left and right, can be measured and tracked). FIG. 17 may be an illustration of data retention loss rate tracking. Block 1702 may be a histogram capture with ramp sensing. Block 1704 may measure DR loss utilizing memory analytics, including a state histogram analysis or via an alternative analysis with separate measurements of BER due to Er, A, B states (RD sensitive) and higher states (C . . . G). The BER memory analysis is further described herein. The histogram analysis was described above. In block 1706, DR loss rate is calculated utilizing the current and previous measurements which may factor in temperature-accelerated stress time. In block 1708, the current BER is estimated at end-of-retention margin. In block 1710, the end-of-retention prediction is updated along with the block's maximum P/E value for wear leveling by utilizing the tracked block's wear rate (which may be orthogonal to DR loss rate).

In other words, the process may include: 1) a histogram capture (e.g ramp sensing); 2) measuring a data retention loss utilizing memory analytics via separate measurements of BER due to Er, A, B states (RD sensitive) and higher states (C . . . G) to remove RD component; 3) calculate DR loss rate utilizing the current and previous measurements (which may factor in temperature-accelerated stress time); 4) estimate the current BER at the end-of-retention margin which is further described below; and 5) update the end-of-retention prediction and the block's maximum P/E value for wear leveling by utilizing the tracked block's wear rate (which may be orthogonal to the DR loss rate). Step 2) using the BER may differ from the embodiments discussed above in which the state histograms are analyzed to measure DR loss. In particular, rather than analyzing a histogram of the voltage state, the BER can be quantized (e.g. the actual number of errors between any two of the states) and used for the analysis. The quantization may include left vs. right overlaps which can be separated. The histogram process described above is merely one embodiment, while the BER method is an alternative embodiment. The BER method may be used to 1) remove RD; 2) track DR changes; and 3) track wear changes.

The diagram in FIG. 24 may be used to identify which errors were local distribution errors or which were from read disturb. The errors from read disturb may be removed by processing the decoded data post-ECC correction such that the errors that were due to Er to A state flips, for example, can be removed from the FBC analysis before the measurements of data retention or wear are made. This method would work for either the default read threshold or the optimized read threshold, as shown in FIG. 24. The table shown in FIG. 24 is showing correspondence between upper, middle, and lower page bits. In particular, it illustrates the correspondence between the states and pages as shown in the chart.

With RD error removed, wear can be measured by measuring additional (since beginning of life) errors at zero retention time. Each block may have different wear rate, as widening of the states, and the resulting error rate may not be a linear function as the errors are results of the states' overlaps.

Figure 25:
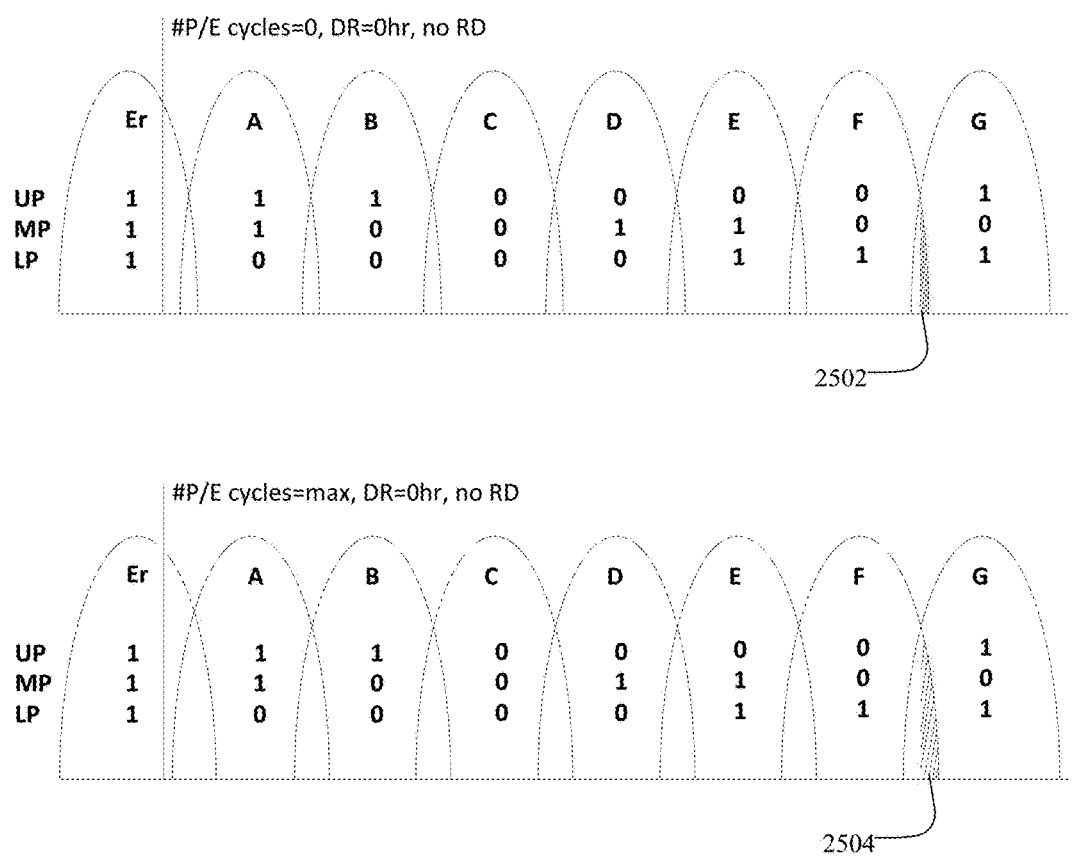
FIG. 25 illustrates a widening effect due to wear.

FIG. 25 illustrates a widening effect due to wear. FIG. 25 also illustrates the difference in overlaps between the states. Overlap 2502 shows errors due to F state misread as G state, which results in some Upper Page bits read as 1 instead of 0. The other side of the overlap would be Upper Page bits misread as 0 instead of 1. The bottom diagram shows the maximum number of P/E cycles with a larger overlap 2504. The upper page (UP), middle page (MP), and lower page (LP) values are shown for each distribution.

The widening effect, which may be measured using different parameters, such as standard deviation, per the histogram method, increases the overlap area size (which is the total number of errors). The function of how wear FBC, or the overlap area, grows with more Program/Erase (P/E) cycles can be used to predict FBC for a certain number of P/E cycles based on at least two parameters: 1) the wear FBC delta, as block's current FBC versus 'fresh' FBC (as measured at P/E=0); and 2) the number of P/E cycles. The function to translate the state widening to FBC (or area size), using the above parameters, may be a formula based or table based.

Figure 26:
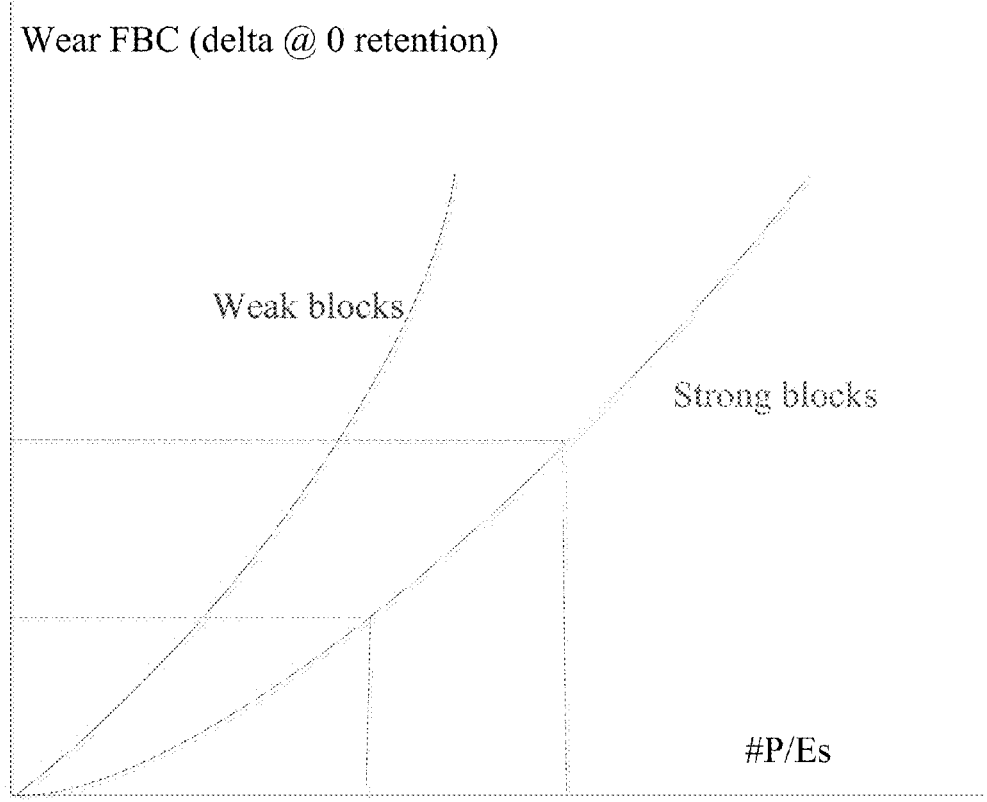
FIG. 26 illustrates the function for translating state widening to failed bit count.

FIG. 26 illustrates the function for translating state widening to FBC. The function may allow for the prediction wear, in FBC terms, at certain number of P/E cycles. This function may be temperature dependent. As the blocks can be different qualities, "weak" blocks can develop wider states faster than "strong" blocks. Although not illustrated, there may be a skew in both FIGS. 25-26.

Figure 27:
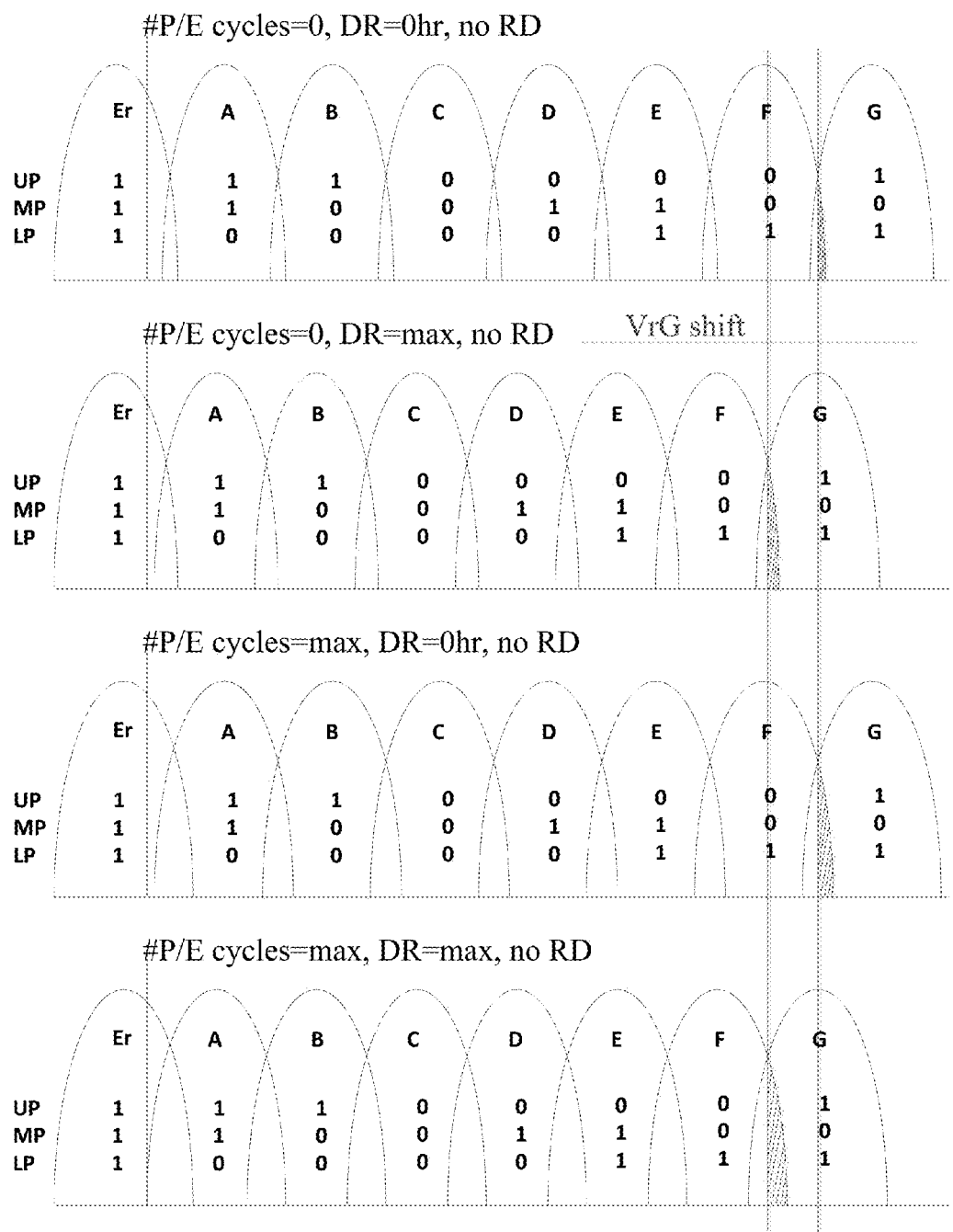
FIG. 27 illustrates data retention errors.

Data retention errors may be due to the state overlaps or upper state shift. FIG. 27 illustrates data retention errors. The shifting of the G state is shown in FIG. 27 with different values. The first diagram illustrates 0 P/E cycles, minimum data retention, and no read disturb (RD). The second diagram illustrates 0 P/E cycles, maximum data retention, and no RD. The third diagram illustrates the maximum number of P/E cycles, minimum data retention, and no RD. The fourth diagram illustrates the maximum number of P/E cycles, maximum data retention, and no RD. The upper page (UP), middle page (MP), and lower page (LP) values are shown for each distribution. FIG. 27 may be similar to the diagrams shown in FIGS. 19-20 except it uses a logarithmic scale.

Figure 28:
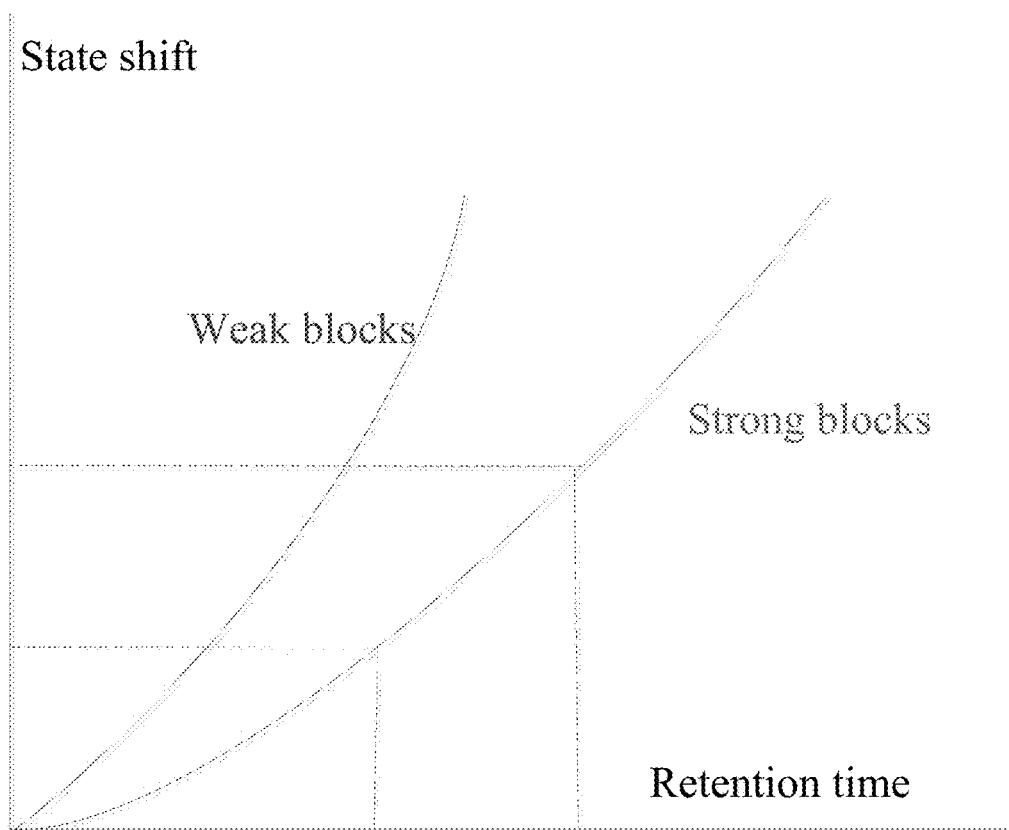
FIG. 28 illustrates state shift and retention time depending on the block.

The shift may be measured directly by finding the optimal read threshold, and then used as a parameter indicating DR loss, in order to calculate DR loss rate. The shift may differ from block to block. FIG. 28 illustrates state shift and retention time depending on the block. Strong blocks have a longer retention time than weak blocks.

Figure 29:
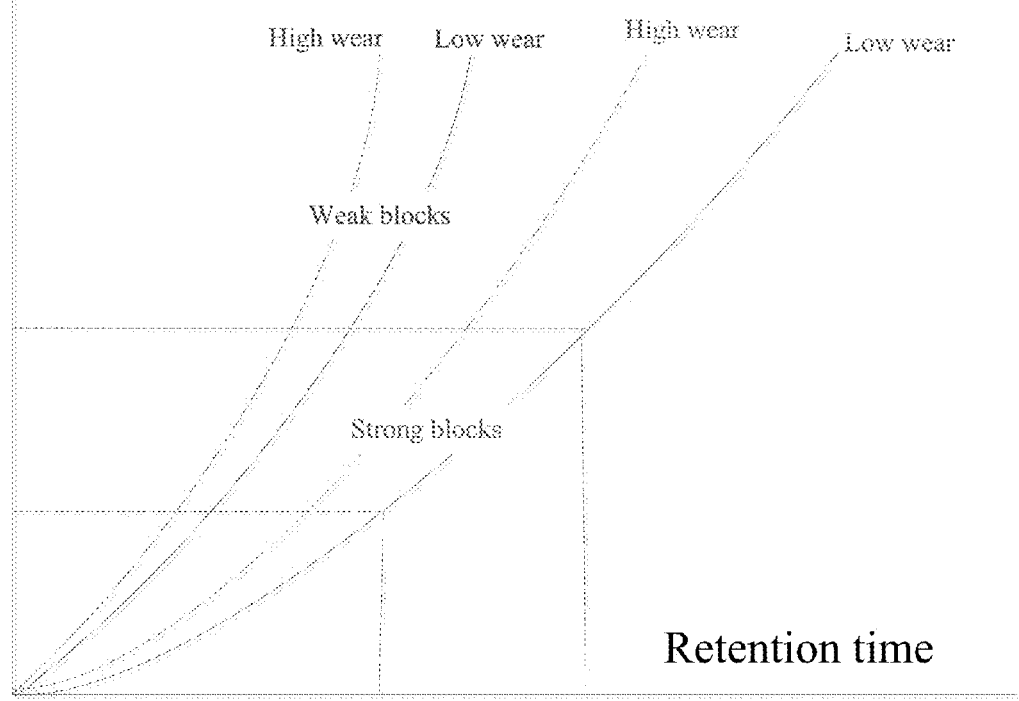
FIG. 29 illustrates an exemplary wear parameter.

The predicted shift (or predicted FBC due to shift) may be used to calculate DR loss rate and predict FBC growth due to DR using a function. The function may be a formula based or table based. It also can also be temperature dependent. DR loss also depends on block wear (worn out blocks have a faster voltage shift and the states themselves are wider), so the overall function may be based cycles and based on at least three parameters: 1) read voltage shift during the retention period, or alternatively, block's DR FBC delta, as current FBC versus zero time FBC (same number of P/E cycles); 2) a block's retention time, to measure DR rate; and 3) a block's wear parameter. FIG. 29 illustrates an exemplary wear parameter. FIG. 29 shows different wear (low/high). In FIG. 29, weak may relate to DR only, and may or may not correlate to a block assumed weak in the aspect of wear.

The combination of wear rate prediction and DR loss rate predictions may be used together to predict FBC at certain retention time and at certain number of P/E cycles. This prediction may be used in different applications such as retention based levelling, where all blocks are used to have the maximum FBC at the minimum retention period.

Retention Trigger

Endurance may be maximized by managing the cycling of cells such that they all ultimately provide the same end of retention error rate at the end of life point. It may be more efficient to minimize data retention traffic and wear in the storage device in some cases such as cold storage. If the underlying retention capability of memory units is now known, this information can be used to predict accurately when data stored within blocks needs to be recycled for retention management purposes, and left untouched otherwise. This may minimize the amount of system traffic being generated for retention management which can be a performance and endurance hit (e.g. in high capacity, cold storage, low endurance memory applications). Retention management may be based on the worst case expected retention capability of all blocks in the system. This may be referred to as the baseline method. If there is some indication of the expected life (or temperature) of the data being stored in the memory unit (e.g. from a detection method or from host hints) (aka 'cold data'), data with an expected long life (i.e. low temperature) may be directed to the memory units with the greatest retention capability. Likewise, data with an expected lower life may be directed to memory units with the worst data retention capability.

Blocks may be refreshed at the maximum allowed retention period, equal to minimum retention requirement for the memory. The analysis may be based on the worst block in the population to guarantee no data loss due to retention. A refresh may include a copy of data to another block, resulting in additional P/E cycle and delay. In order to reduce wear and prevent performance loss, the retention trigger may include measuring retention rate and predicting the maximum BER. The block is refreshed only when necessary and unnecessary P/E cycles and delays are minimized. This may be used for high capacity, cold storage, low endurance memory drives, with high retention triggered data traffic and cycling. The end of life prediction may be used to reduce retention triggered operations such as block refreshment or rewriting operations. There may be a brute force method to measure BER and trigger DR refresh copy when BER is close to the maximum. This method may not be practical due to the need to scan a significant amount of memory frequently (patrol). It may require more margin, data traffic, and/or power. Also, it may be not possible to do it all the time if the drive is powered off. Tracking DR rate may be more effective.

Figure 30:
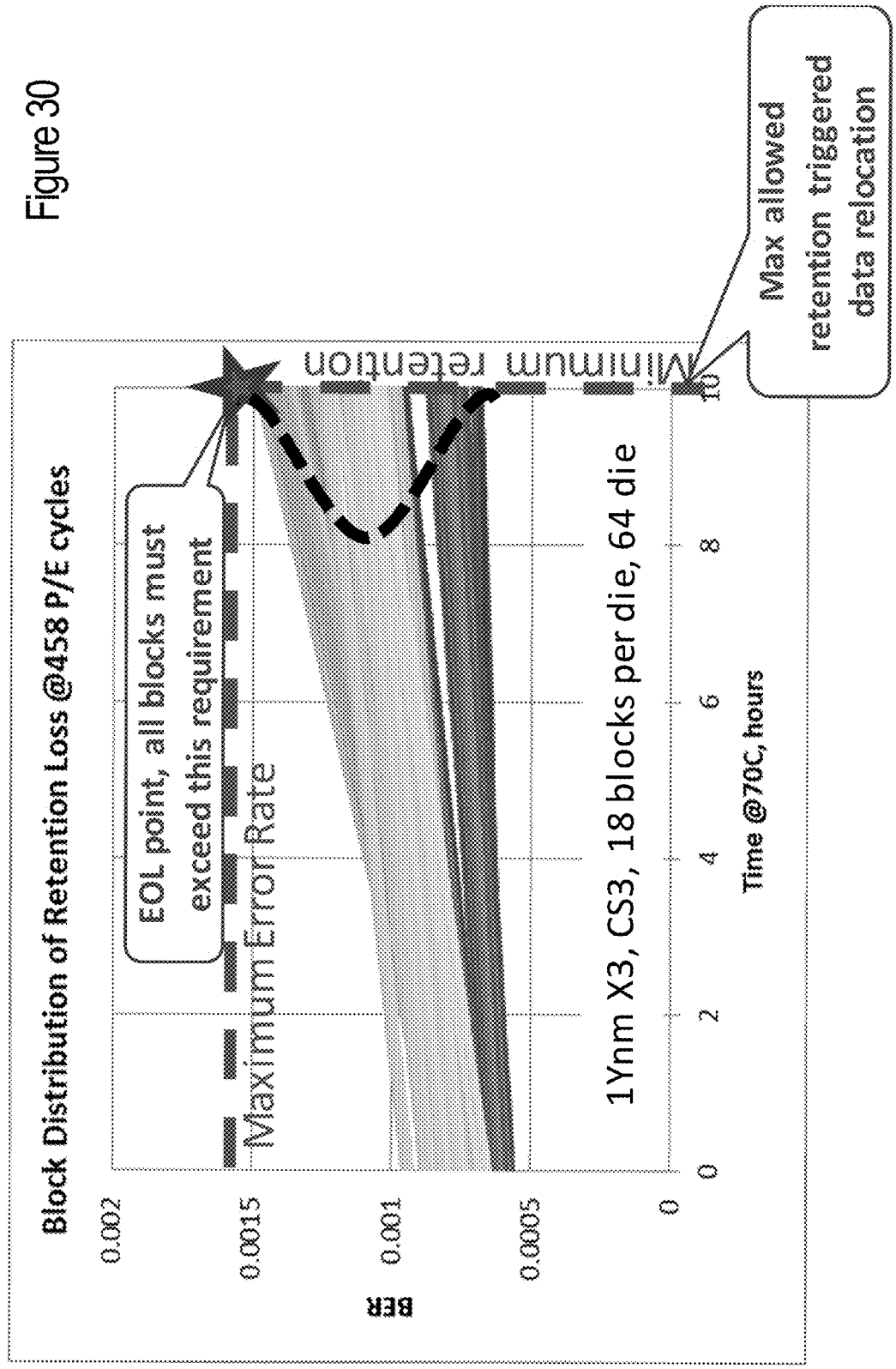
FIG. 30 illustrates the end of life point for multiple bit error rate (BER) trajectories.

Referring back to FIG. 16, the slope of the bit error rate may be changed based on read disturb. This change in slope prevents an accurate determination of end of life. Accounting for read disturb can allow for a more accurate trajectory of the bit error rate to further identify the end of life point. FIG. 30 illustrates the end of life point for multiple bit error rate (BER) trajectories. Accordingly, an estimate can be made for end of life, but due to the effects of read disturb this calculation may be incorrect.

Figure 31:
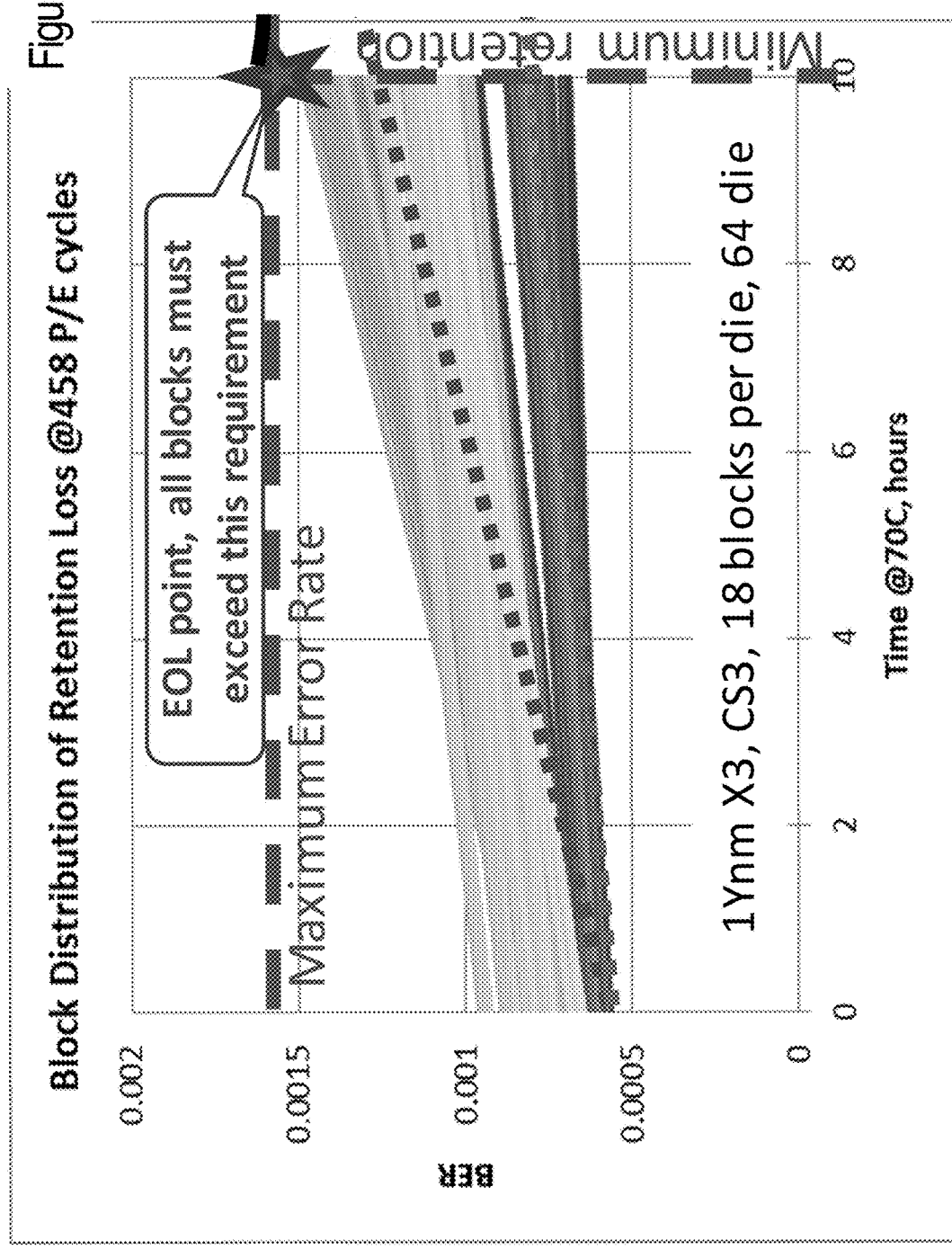
FIG. 31 illustrates different BER slopes that originate from the same initial BER value.

FIG. 31 illustrates different BER slopes that originate from the same initial BER value. In particular, the two dotted lines have the same initial BER value but the slopes are different which changes the end of life prediction time. Accordingly, determining end of life requires the analysis of read disturb and/or data retention discussed above for accurately determining the slope of the BER.

Figure 32:
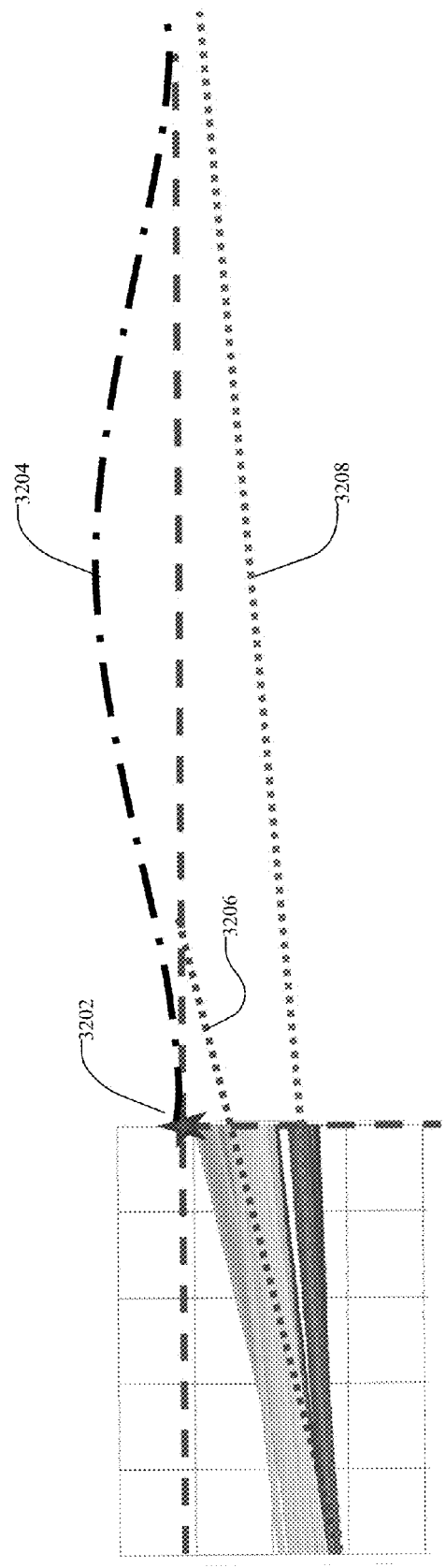
FIG. 32 illustrates an extension of FIG. 31 showing an average of BER slopes.

FIG. 32 illustrates an extension of FIG. 31 with different BER slopes. The end of life point 3202 may be when the maximum error rate (see FIG. 31) is met with the minimum retention (see FIG. 31). Two examples are shown in FIG. 32 with different BER slopes. Slope 3206 has a higher BER and reaches the maximum error rate in less time than the slope 3208 which has a lower BER and reaches the maximum error rate in more time. By utilizing the slopes of all (or a representative number) of blocks, the maximum BER point may be predicted. An average curve 3204 may be calculated by the prediction of the point when the different blocks reach the maximum error rate. Curve 3204 may only illustrate the distribution. It may be calculated to estimate the overall benefit of the method. In the device itself, it may be used to estimate time left limited by DR triggered refresh copies if the host never accesses the drive. FIG. 32 illustrates an exemplary average curve 3204 that illustrates a range of time when the maximum error rate is likely to be met.

Figure 33:
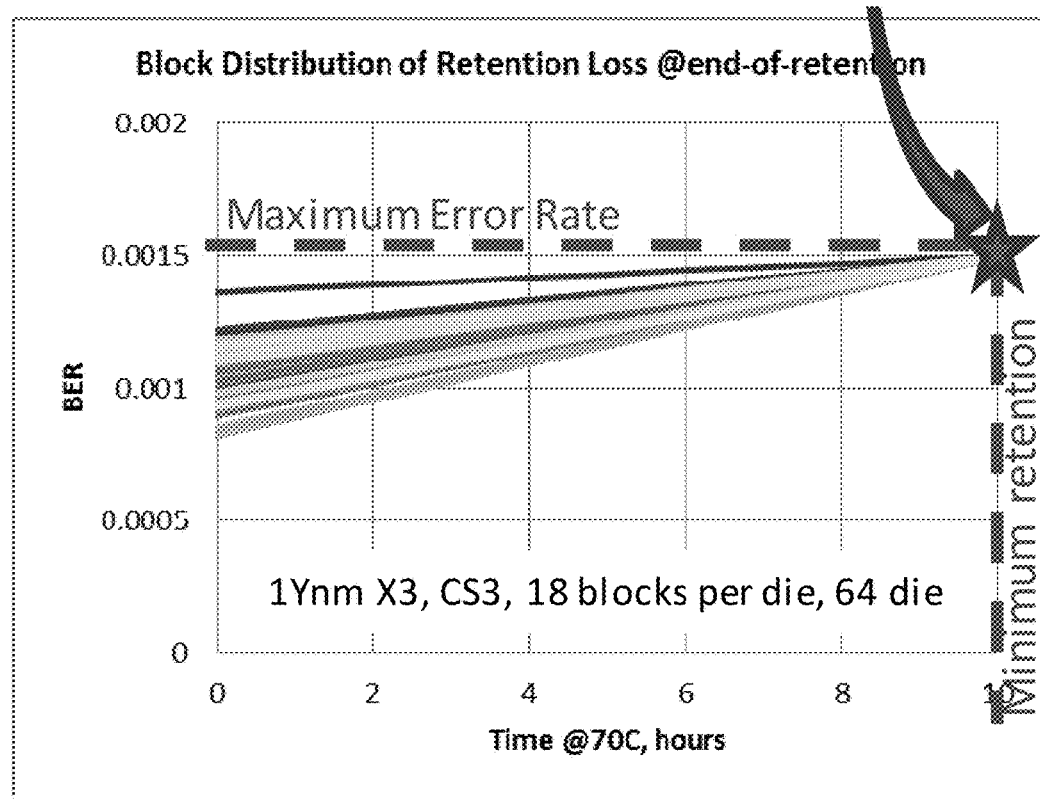
FIG. 33 illustrates calculating the BER can be used for a more accurate end of life calculation.

FIG. 33 illustrates calculating the BER can be used for a more accurate end of life calculation. Additional reads may accelerate overall error rate so DR on its own either cannot be used, or should include RD margin. In particular, by measuring each block's data retention loss rate and/or read disturb signature, the BER can be predicted at end of life. Accordingly, blocks can be leveled so that the BER of each block can be directed towards the same end of life point.

Determining the slope of the BER for each block can be used to predict the end of life for that particular block. Wear leveling can be used so that the BER slope for each block is extended towards the same end of life point as shown in FIG. 33.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/ or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method for memory cell analysis in a memory device comprising:
    periodically determining a cell voltage distribution of cells in the memory device during run time;
    measuring changes in the cell voltage distribution from the periodic determinations;
    calculating a wear of the cells based on a shape change from the measured changes in the cell voltage distribution; and
    calculating a data retention value of the cell based on a location change in the cell voltage distribution, wherein the wear and data retention value are independent variables such that the calculating of the wear and the calculating of the data retention do not affect one another.

2. The method of claim 1 wherein the cell voltage distribution comprises a histogram.

3. The method of claim 2 wherein the shape change comprises a measurement of skewness of the cell voltage distribution.

4. The method of claim 3 wherein the skewness is calculated using Pearson's shape parameter.

5. The method of claim 2 wherein the location change comprises a measurement of an average of the cell voltage distribution.

6. The method of claim 1 wherein the cell voltage distribution is normalized with respect to a highest value on a y-axis and the changes measured are based on changes to an x-axis of the cell voltage distribution.

7. The method of claim 1 wherein the memory device comprises a non-volatile storage comprising memory blocks that include the memory cells.

8. The method of claim 6 wherein a controller is associated with operation of the memory blocks.

9. The method of claim 8 wherein the controller performs the memory analysis.

10. A method for measuring data retention comprising:
    performing the following in a storage module:
        measuring a voltage distribution of an upper state for each cell in a memory;
        calculating a location of the voltage distribution over time; and
        quantizing a data retention based on a change in the calculated location.

11. The method of claim 10 wherein the location comprises a calculation of at least one of a mean, a mode, or a median of the voltage distribution.

12. A method for measuring wear comprising:
    performing the following in a storage module:
        measuring, periodically, voltage distribution of an upper state for each cell in a memory;
        calculating a width of the distribution over a certain number of cycles; and
        quantizing wear based on changes to the width.

13. The method of claim 12 wherein the width comprises a calculation of a standard deviation of the voltage distribution.

* * * * *